US011776812B2

(12) United States Patent
Fulford et al.

(10) Patent No.: US 11,776,812 B2
(45) Date of Patent: Oct. 3, 2023

(54) METHOD FOR PATTERN REDUCTION USING A STAIRCASE SPACER

(71) Applicant: Tokyo Electron Limited, Tokyo (JP)

(72) Inventors: Daniel Fulford, Cohoes, NY (US); Anton J. Devilliers, Clifton Park, NY (US)

(73) Assignee: Tokyo Electron Limited, Tokyo (JP)

( * ) Notice: Subject to any disclaimer, the term of this patent is extended or adjusted under 35 U.S.C. 154(b) by 323 days.

(21) Appl. No.: 17/325,425

(22) Filed: May 20, 2021

(65) Prior Publication Data

US 2021/0366713 A1    Nov. 25, 2021

Related U.S. Application Data

(60) Provisional application No. 63/028,619, filed on May 22, 2020, provisional application No. 63/029,072, filed on May 22, 2020.

(51) Int. Cl.
*H01L 21/033*    (2006.01)
*H01L 21/027*    (2006.01)

(52) U.S. Cl.
CPC ...... *H01L 21/0337* (2013.01); *H01L 21/0276* (2013.01); *H01L 21/0332* (2013.01); *H01L 21/0338* (2013.01)

(58) Field of Classification Search
CPC ............. H01L 21/0337; H01L 21/0276; H01L 21/0332; H01L 21/0338
USPC .......................................................... 430/323
See application file for complete search history.

(56) References Cited

U.S. PATENT DOCUMENTS

| | | | |
|---|---|---|---|
| 7,611,980 B2 | 11/2009 | Wells et al. | |
| 8,236,697 B2 | 8/2012 | Chang et al. | |
| 8,551,691 B2 | 10/2013 | Yaegashi | |
| 8,557,704 B2 | 10/2013 | Wells et al. | |
| 8,883,644 B2 | 11/2014 | Wells et al. | |
| 9,240,329 B2 | 1/2016 | Devilliers | |
| 9,263,297 B2 | 2/2016 | Devilliers | |

(Continued)

FOREIGN PATENT DOCUMENTS

KR    10-2010-0070927 A    6/2010

OTHER PUBLICATIONS

International Search Report and Written Opinion dated Sep. 17, 2021 in PCT/US2021/033777.

*Primary Examiner* — Caleen O Sullivan
(74) *Attorney, Agent, or Firm* — Oblon, McClelland, Maier & Neustadt, L.L.P.

(57) ABSTRACT

Devices are made by self-aligned quad pitch patterning (SAQP), staircase patterning and double staircase patterning. Methods for making devices by self-aligned quad pitch patterning (SAQP) use a single spacer in the process. Methods for making devices by staircase patterning and double staircase patterning do not use a spacer. An intermediate process step called self-aligned double patterning (SADP) is used to double the pitch following the spacer deposition. A pattern is formed on a substrate, the pattern having ultra-fine resolutions by repeating the SADP step twice for pitch quadrupling and introducing a reversal layer to form a fine trench pattern and hole pattern. The pattern designs or pattern layouts have improved LER/LWR (line edge roughness and line width roughness respectively) for below 12 nm lines and trenches in order to create self-aligned cross pitch quad trenches.

20 Claims, 20 Drawing Sheets

(56) References Cited

U.S. PATENT DOCUMENTS

| | | |
|---|---|---|
| 9,437,447 B2 | 9/2016 | Devilliers |
| 9,478,497 B2 | 10/2016 | Wells et al. |
| 9,773,680 B1* | 9/2017 | Zang ............... H01L 21/823431 |
| 10,312,088 B1* | 6/2019 | Chang ................. H01L 21/0335 |
| 2008/0057692 A1* | 3/2008 | Wells .................. H01L 21/3088 |
| | | 257/E21.235 |
| 2009/0026584 A1 | 1/2009 | Chang et al. |
| 2010/0029081 A1 | 2/2010 | Wells et al. |
| 2010/0144150 A1* | 6/2010 | Sills .................. H01L 21/31138 |
| | | 438/694 |
| 2012/0202301 A1 | 8/2012 | Yaegashi |
| 2014/0038416 A1 | 2/2014 | Wells et al. |
| 2015/0054168 A1 | 2/2015 | Wells et al. |
| 2015/0214070 A1 | 7/2015 | De Villiers |
| 2015/0243519 A1* | 8/2015 | deVilliers ......... H01L 21/31111 |
| | | 438/692 |
| 2020/0066522 A1* | 2/2020 | deVilliers ........... H01L 21/0337 |
| 2021/0366714 A1* | 11/2021 | Fulford ............... H01L 21/0338 |

* cited by examiner

METHOD FOR PATTERN REDUCTION USING A STAIRCASE SPACER

CROSS REFERENCE TO RELATED APPLICATIONS

The present application claims the benefit of U.S. Prov. Ser. No. 63/029,072, entitled "Method For Pattern Reduction Using A Staircase Spacer", filed on May 22, 2020, and U.S. Prov. Ser. No. 63/028,619, "Method For Pattern Reduction Using Staircase Spacer" filed on May 22, 2020. Each of the above applications is incorporated by reference herein.

FIELD OF THE INVENTION

The present disclosure relates to microfabrication of integrated circuits and semiconductor devices.

BACKGROUND

Semiconductor technologies are continually progressing to smaller feature sizes of 14 nanometers and below. The continual reduction in sizes of features, from which the foregoing elements are fabricated, places ever-greater demands on techniques used to form the features. The concept of "pitch" can be used to describe the sizing of these features. Pitch is the distance between the two identical points in two adjacent repetitive features.

Pitch reduction techniques, also termed "pitch multiplication" as exemplified by "pitch doubling" and "pitch quadrupling," can extend the capabilities of photolithography beyond the feature size limitations. That is, conventional "multiplication" of pitch by a certain factor actually involves reducing the pitch by that factor. Double patterning techniques (DPT) with 193 nm immersion lithography are considered to be promising techniques for the 22 nm node and beyond. Self-aligned spacer double patterning (SADP) has been established as a routine pitch doubling process and has been adapted to high volume manufacturing of NAND flash memory devices.

Each of the aforementioned techniques suffers from one or more drawbacks hindering their adoption. Accordingly, it is one object of the present disclosure to provide methods and systems for obtaining ultra-fine resolutions by repeating the SADP step twice for pitch quadrupling and introducing a reversal layer to form a fine trench pattern and hole pattern.

The "background" description provided herein is for the purpose of generally presenting the context of the disclosure. Work of the presently named inventors, to the extent it is described in this background section, as well as aspects of the description which may not otherwise qualify as prior art at the time of filing, are neither expressly or impliedly admitted as prior art against the present invention.

SUMMARY OF THE INVENTION

Aspects of the present disclosure methods and structures for obtaining ultra-fine resolutions by repeating a pitch doubling step twice and introducing a reversal layer to form a fine trench pattern and hole pattern.

In a first embodiment, a method for patterning a substrate is described comprising depositing a stack of layers on the substrate, the stack of layers comprising a first layer deposited on a second layer, the second layer deposited on at least one underlying layer; forming a first relief pattern of lines from a first layer and a second layer, wherein the relief pattern of lines, defined by the first layer and the second layer, has a line-to-space ratio of 5:3 in that each line has an initial line width of five units while each space between lines has an initial space width of three units, line edges of each line of the first layer being aligned with line edges of a corresponding line of the second layer; executing a first etch process, the first etch process being an isotropic etch that etches a material of the first layer without etching a material of the second layer and without etching a material of the at least one underlying layer, the first etch process being executed until the initial line width of each line from the first layer is reduced to one fifth of the initial line width, resulting in the lines of the first layer being centered on the lines of the second layer, the lines of the second layer maintaining a line width of five units; forming sidewall spacers on each line of the first layer and the second layer, the sidewall spacers being formed simultaneously on the first layer and the second layer; and transferring, by selective anisotropic etching, a second relief pattern into at least one of the underlying layers, the second relief pattern defined by the sidewall spacers formed on the first layer and on the second layer, the second relief pattern formed in the at least one underlying layer resulting in a line-to-space ratio of 1:1, wherein each line and each space has a width of one unit.

In a second embodiment, a method for patterning a substrate is described, the pattern having a line-to-space ratio of one-to-one, comprising forming a first stack of layers on the substrate, the first stack including a first layer deposited over the substrate, a second layer deposited over the first layer, a third layer deposited over the second layer and a fourth layer deposited over the third layer, each of the layers of the first stack having an initial width that is equal; forming a first relief pattern on the stack of layers, by executing a first trimming etch process on the fourth layer, the first trimming etch process being an isotropic etch that etches material of the fourth layer without etching material of the second layer and without etching material of the third layer, the first trimming first etch process being executed until the initial width of the fourth layer is reduced to a first line of a first desired line width; executing a second trimming etch process on the third layer, the second trimming etch process being an isotropic etch that etches material of the third layer without etching material of the fourth layer and without etching material of the second layer, the second trimming etch process being executed until the initial width of the third layer is reduced to a second line having a line width which is three times the first desired line width; executing a third trimming etch process on the second layer, the third trimming etch process being an isotropic etch that etches material of the second layer without etching material of the first layer and the third layer, the third trimming etch process being executed until the initial width of the second layer is reduced to a third line having a line width which is five times the first desired line width; depositing a first fill material on the fourth, third and second layers; etching a portion of the first fill material to expose a top of the first line; etching the first line through the fourth, third and second layers down to the substrate, thus forming a first central bore; removing, by etching, the third layer and the fourth layer; depositing a second fill material in the first central bore; removing a portion of the first fill material to expose a part of the second layer; selectively etching through the part of the second layer not covered by the second fill material and through portions of the first layer not covered by the first fill material; removing the first fill material and the second fill material; etching remaining portions of the second layer, resulting in the first layer having a second relief pattern of four lines with line-to-space pitch ratio of 1:1, wherein each line and each space has a width of one fifth of the first desired line width.

In a third embodiment, a method for patterning a substrate is described, the method comprising: forming a first stack of layers on a substrate, the first stack including a memorization layer deposited over the substrate, a first nitride layer deposited over the first memorization layer, a first amorphous carbon layer deposited over the first nitride layer and a first oxide layer deposited over the first amorphous carbon layer; forming a second stack of layers over the first stack of layers, the second stack including a second nitride layer deposited over the first oxide layer, a second amorphous carbon layer deposited on the second nitride layer, a second oxide layer deposited over the second amorphous carbon layer, an organic planarization layer deposited over the second oxide layer and a silicon anti-reflective coating deposited over the organic planarization layer, wherein each of the layers of the first stack and second stack having an initial width that is equal; depositing a photoresist relief pattern over the silicon anti-reflective coating; transferring, by selective anisotropic etching, the photoresist relief pattern into the silicon anti-reflective coating, the organic planarization layer, the second oxide layer, and the second amorphous carbon layer, then removing the photoresist, the anti-reflective coating and the organic planarization layer; executing a first trimming etch process on the second oxide layer, the first trimming etch process being an isotropic etch that etches material of the second oxide layer without etching material of the second amorphous carbon layer and without etching material of the second nitride layer, the first trimming etch process being executed until the initial width of each line of the second oxide layer is reduced to one fifth of a line width of each line of the photoresist relief pattern; executing a second trimming etch process on the second amorphous carbon layer, the second trimming etch process being an isotropic etch that etches material of the amorphous carbon layer without etching material of the second oxide layer and without etching material of the second nitride layer, the second trimming etch process being executed until the initial width of each line of the amorphous carbon layer is reduced to three fifths of the line width of each line of the photoresist relief pattern; depositing a first fill material on the second oxide layer, the amorphous carbon layer and the second nitride layer; etching a portion of the first fill material to expose a top of the lines of the second oxide layer; etching the lines of the second oxide layer down through the second amorphous carbon layer, then removing the first fill material, the lines of the second amorphous carbon layer forming a second relief pattern; transferring, by selective anisotropic etching, the second relief pattern into the second nitride layer, the first oxide layer, and the first amorphous carbon layer, then removing the second amorphous carbon layer and the second nitride layer; executing a fourth trimming etch process on the first oxide layer, the fourth trimming etch process being an isotropic etch that etches material of the first oxide layer without etching material of the first amorphous carbon layer or material of the first nitride layer, the fourth trimming etch process being executed until a width of the lines of the first oxide is reduced to one third of the line width of the second relief pattern; depositing a second fill material on the first oxide layer, the first amorphous carbon layer and the first nitride layer; etching a portion of the second fill material to expose a top of the lines of the first oxide layer; etching the lines of the first oxide layer down through the first amorphous carbon layer, then removing the second fill material, thus forming a third relief pattern; transferring, by selective anisotropic etching, the third relief pattern into the first nitride layer, then removing the first amorphous carbon layer, thus forming a fourth relief pattern; transferring, by selective anisotropic etching, the fourth relief pattern into the memorization layer, then removing the first nitride layer, resulting in the memorization layer having a pattern of eight lines with line-to-space pitch ratio of 1:1, wherein each line and each space has a width of one eighth of the initial line width.

The order of discussion of the different steps as described herein has been presented for the sake of clarity. In general, these steps can be performed in any suitable order. Additionally, although each of the different features, techniques, configurations, etc. herein may be discussed in different places of this disclosure, it is intended that each of the concepts can be executed independently of each other or in combination with each other. Accordingly, the present invention can be embodied and viewed in many different ways.

Note that this summary section does not specify every embodiment and/or incrementally novel aspect of the present disclosure or claimed invention. Instead, this summary only provides a preliminary discussion of different embodiments and corresponding points of novelty over conventional techniques. For additional details and/or possible perspectives of the invention and embodiments, the reader is directed to the Detailed Description section and corresponding figures of the present disclosure as further discussed below.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein.

DETAILED DESCRIPTION OF THE PREFERRED EMBODIMENTS

Figure 1A:
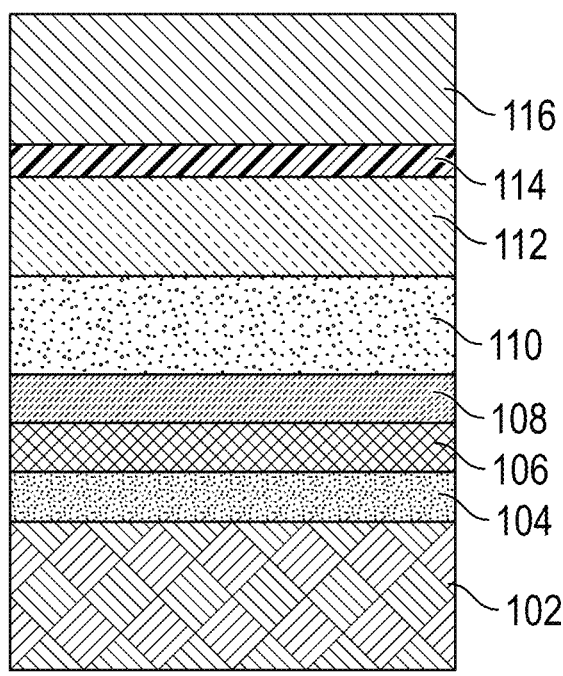
FIG. 1A illustrates a stack of layers with a layer of photoresist on top, according to certain embodiments.

Referring now to the drawings, wherein like reference numerals designate identical or corresponding parts throughout the several views.

Aspects of the present disclosure describe process flows with a pattern designs or pattern layouts having improved LER/LWR (line edge roughness and line width roughness respectively) for below 12 nm lines and trenches in order to create self-aligned cross pitch quad trenches. The initial pattern is obtained by the X-Y double line exposures. Reverse material is applied on the initial pattern and subsequent etching process converts each initial trench pattern to a line.

Techniques herein provide a patterning flow that provides improved LER and LWR at least for lines and trenches of 12 nm and below. For ease in describing embodiments, reference will be made to specific materials for particular layers, but it should be understand that many alternate materials and combinations can be selected instead. Etch properties of various materials are conventionally understood and particular materials can be selected to provide etch selectivity (etching one material without substantially etching another material.

Aspects of the present disclosure describe devices made by self-aligned quad pitch patterning (SAQP) and methods for making devices by self-aligned quad pitch patterning (SAQP) using a single spacer in the process. An intermediate process step called self-aligned double patterning (SADP) is used to double the pitch following the spacer deposition.

In a first process flow, shown in FIG. 1A-FIG. 1L, layers are stacked with resist on top. A lithographic exposure is executed with a line-to-space pitch ratio of 5:3. The pattern is transferred to multiple underlying layers. An isotropic oxide etch is executed selective to an underlying layer to reduce the initial pattern width to ⅕ its initial line thickness. Spacers are formed on the reduced-thickness line as well as on the thicker underlying layer. This provides spacers on different planes to be transferred to an underlying layer.

FIG. 1A illustrates a stack of layers with a layer of photoresist on top formed on a substrate 102. A memorization layer 104 can be a hardmask or metal hard mask and is formed over the substrate 102. The memorization layer 104 may include any one of TEOS, low temperature oxide, deep ultraviolet light absorbing oxide, a low-temperature amorphous silicon or poly silicon, boron, germanium, copper, an inorganic metal or the like. An etch stop layer 106 can also act as a memorization layer, and is formed over the memorization layer 104. The etch stop layer 106 can be formed of silicon nitride, silicon carbide, silicon carbonitride, and the like. A silicon nitride layer (SiN) 108 (layer 108 may alternatively be a titanium nitride layer (TiN)) is formed on the etch stop layer 106, an oxide layer 110 (silicon dioxide or titanium dioxide) is formed on the SiN layer, an amorphous carbon layer 112 is formed on the oxide layer, a silicon-containing anti-reflective coating 114 (Si-ARC or BARC) is formed on the amorphous carbon layer 112, and the layer of photoresist 116 is deposited on top. Note that additional interfacial layers and intermediate layers can be included. Each upper layer is selective to the underlying layer for etching.

Figure 1B:
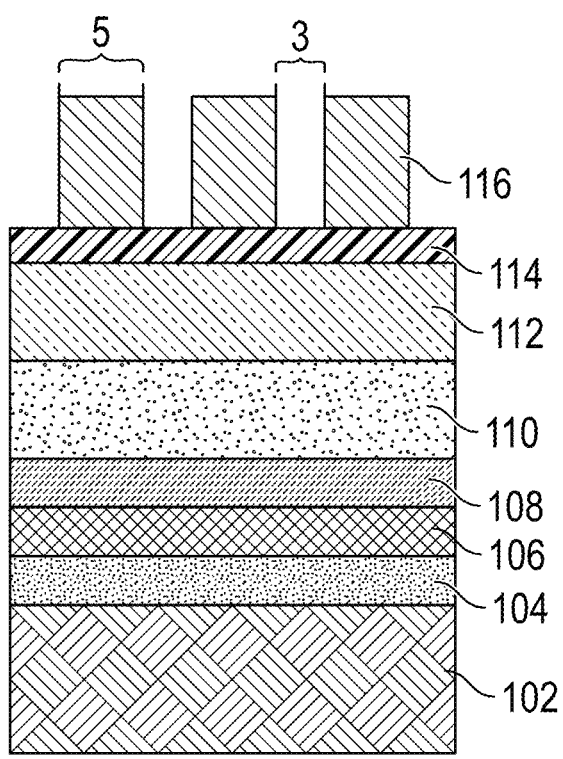
FIG. 1B illustrates a relief pattern formed in the photoresist, according to certain embodiments.

As shown in FIG. 1B, the substrate is exposed to a pattern of actinic radiation that defines a line-to-space pitch ratio of 5:3. That is, lines are five units wide and spaces between lines are three units wide. The latent pattern is developed using a solvent to etch a relief pattern with this 5:3 ratio in photoresist 116. With the 5:3 pitch pattern formed, this pattern can be transferred into one or more underlying target layers, such as by anisotropic (directional) plasma-based reactive etching.

Figure 1C:
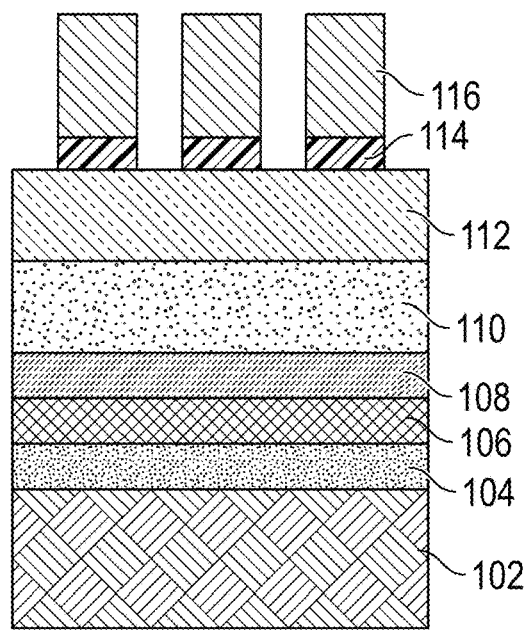
FIG. 1C illustrates the transfer of the relief pattern into an underlying layer, according to certain embodiments.

In FIG. 1C, the 5:3 pattern is transferred into the Si-ARC layer 114.

Figure 1D:
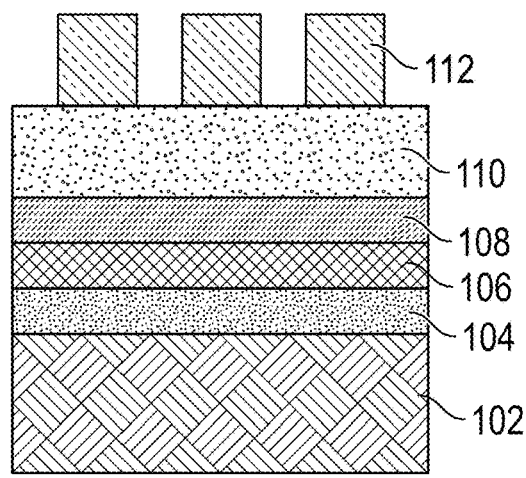
FIG. 1D illustrates the transfer of the relief pattern into a layer underlying the layer of FIG. 1C., according to certain embodiments.

In FIG. 1D, the 5:3 pattern is transferred into the amorphous carbon layer 112 and the Si-ARC layer 114 and photoresist 116 are removed.

Figure 1E:
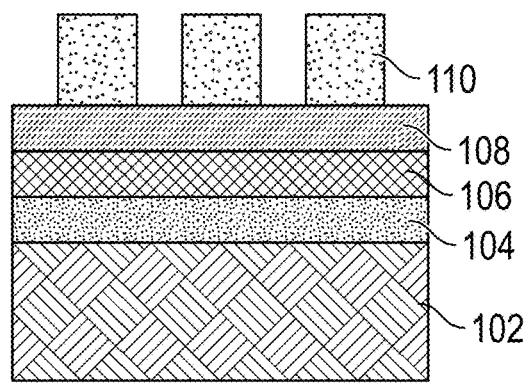
FIG. 1E illustrates the transfer of the relief pattern into an oxide layer underlying the layer of FIG. 1D, according to certain embodiments.

In FIG. 1E, the 5:3 pattern is transferred into the oxide layer 110 and the amorphous carbon layer 112 is removed.

Figure 1F:
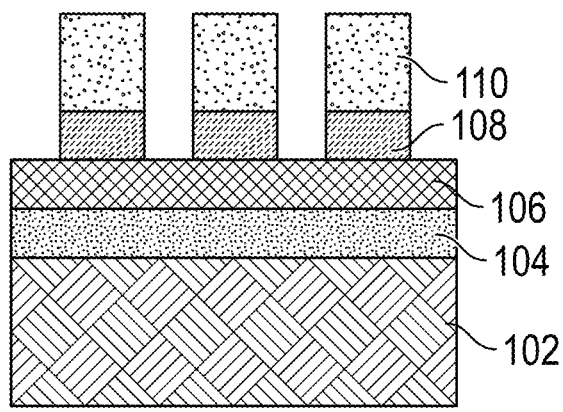
FIG. 1F illustrates the transfer of the relief pattern into a nitride layer underlying the layer of FIG. 1E, according to certain embodiments.

In FIG. 1F, the 5:3 pattern is transferred into the SiN layer 108, retaining the oxide layer 110 on the top of the SiN layer.

Figure 1G:
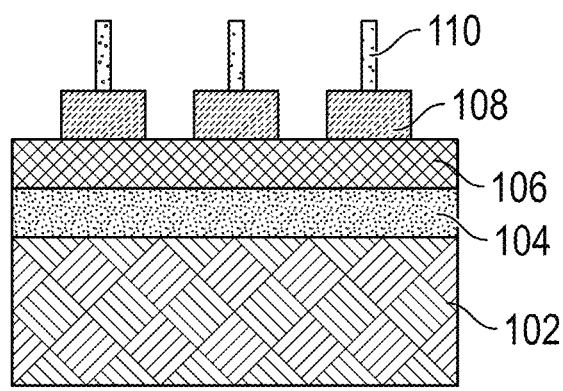
FIG. 1G illustrates trimming the oxide layer to one-fifth of its initial line width, according to certain embodiments.

Any remaining layers above the oxide layer are removed. As shown in FIG. 1G, a first isotropic (non-directional) etch is executed that reduces the line widths of the oxide lines to one fifth of the initial line width. Thus, ⅖ of the initial line width can be etched away from the top and each side of a given line of the oxide 110. This oxide etch is selective to the SiN layer 108 and the etch stop layer 106.

Figure 1H:
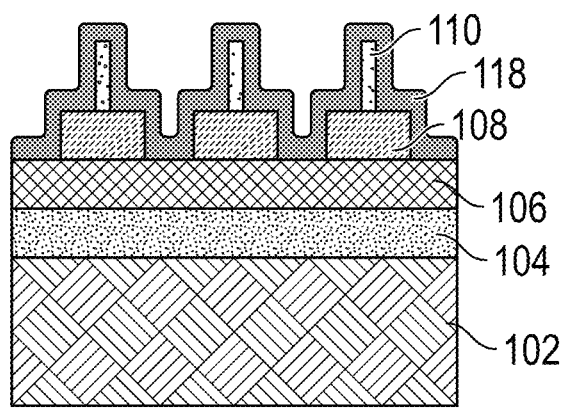
FIG. 1H illustrates a spacer deposited over the substrate, according to certain embodiments.

In FIG. 1H, a spacer deposition is then executed on the substrate. The spacer deposition conformally deposits a film for defining spacers 118 on the substrate. Thus this spacer deposition follows the 5:3 pattern ratio of the SiN layer 108, as well as the ⅕ line size/mandrel size of the oxide layer 110 still remaining on the SiN layer 108. The spacer may be formed from silicon, silicon dioxide, silicon oxycarbide (SiOC), silicon nitride (SiN), or the like.

Figure 1I:
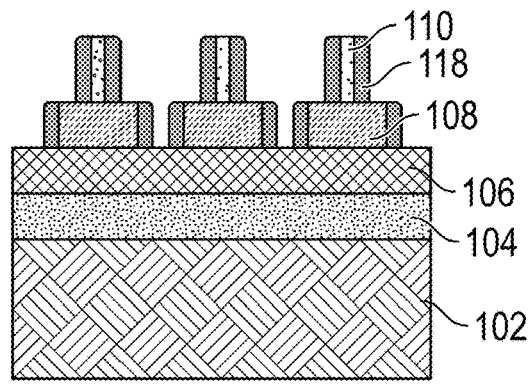
FIG. 1I illustrates the formation of sidewall spacers, according to certain embodiments.

In FIG. 1I, a spacer etch back process is executed that directionally etches the spacer material down to the top of oxide layer 110 and cuts between SiN layer 108 lines, thus clearing spacer material from horizontal surfaces and leaving sidewall spacers on sidewalls of oxide 110 and SiN layer 108 mandrels on the substrate.

Figure 1J:
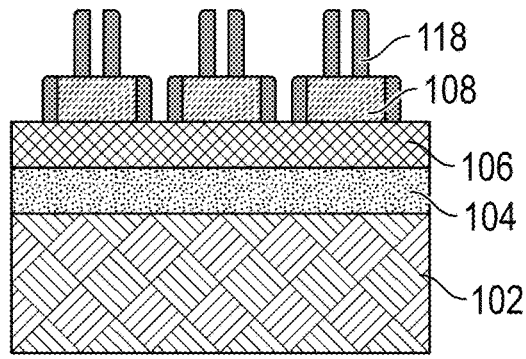
FIG. 1J illustrates removal of the oxide mandrel, according to certain embodiments.

The oxide mandrels can then be removed from between the spacer sidewalls as shown in FIG. 1J, leaving the spacer material above the SiN layer 108 and spacer sidewalls on either side of the SiN layer 108.

Figure 1K:
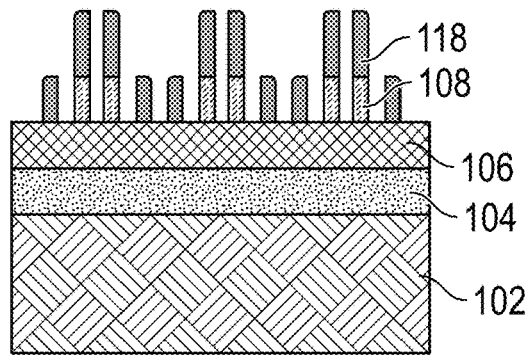
FIG. 1K illustrates the nitride layer etched in the areas not protected by spacers, according to certain embodiments.

An anisotropic etch can be executed that etches portions of the SiN layer not covered by spacers as shown in FIG. 1K. The pattern defined by spacers 118 on two or more planes can be transferred into one or more underlying layers such as the etch stop layer 106 and/or memorization layer 104.

Figure 1L:
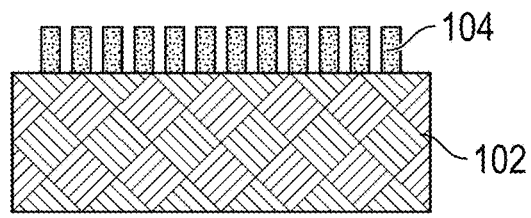
FIG. 1L illustrates the substrate having the third relief pattern transferred into a memorization layer overlying the substrate, according to certain embodiments.

FIG. 1L shows that the three original lines etched in photoresist 116 shown in FIG. 1B have quadrupled to twelve evenly spaced lines. Additional patterning can then be continued from this point to further reduce the line widths if desired.

Figure 1M:
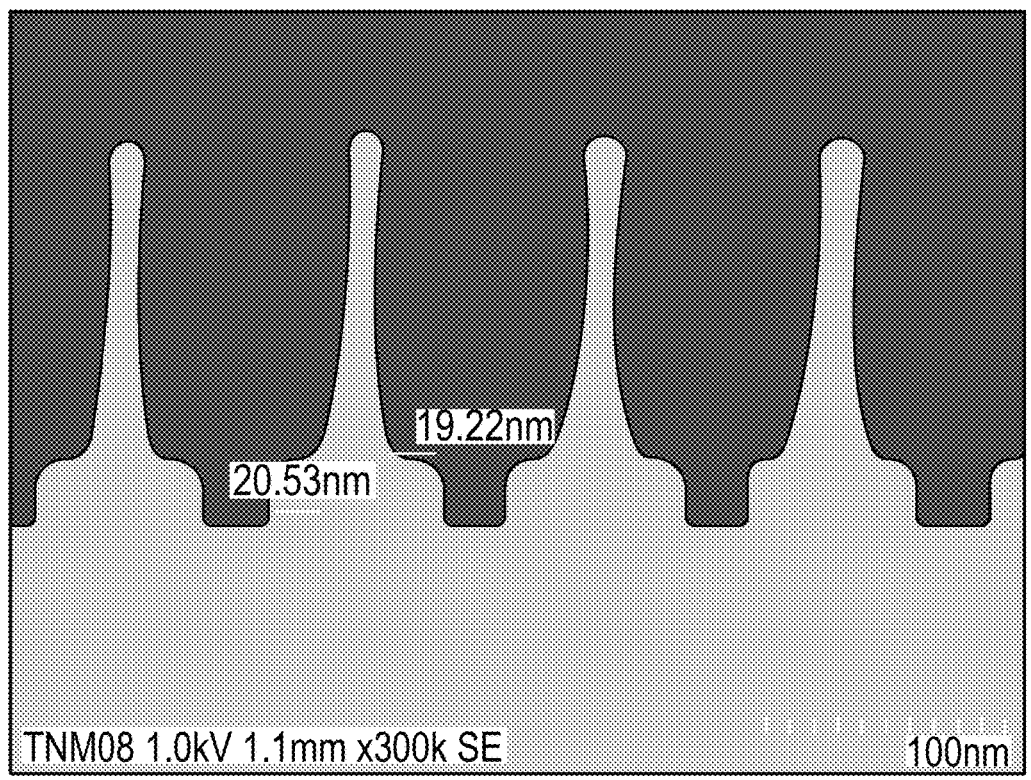
FIG. 1M illustrates an SEM photograph of the third relief pattern, according to certain embodiments.

FIG. 1M is a representation of an SEM photograph of the pattern showing the line and space widths of an intermediate step of the isotropic etch. The line widths taper, but widths of each line are each approximately 12 nm.

Figure 1N:
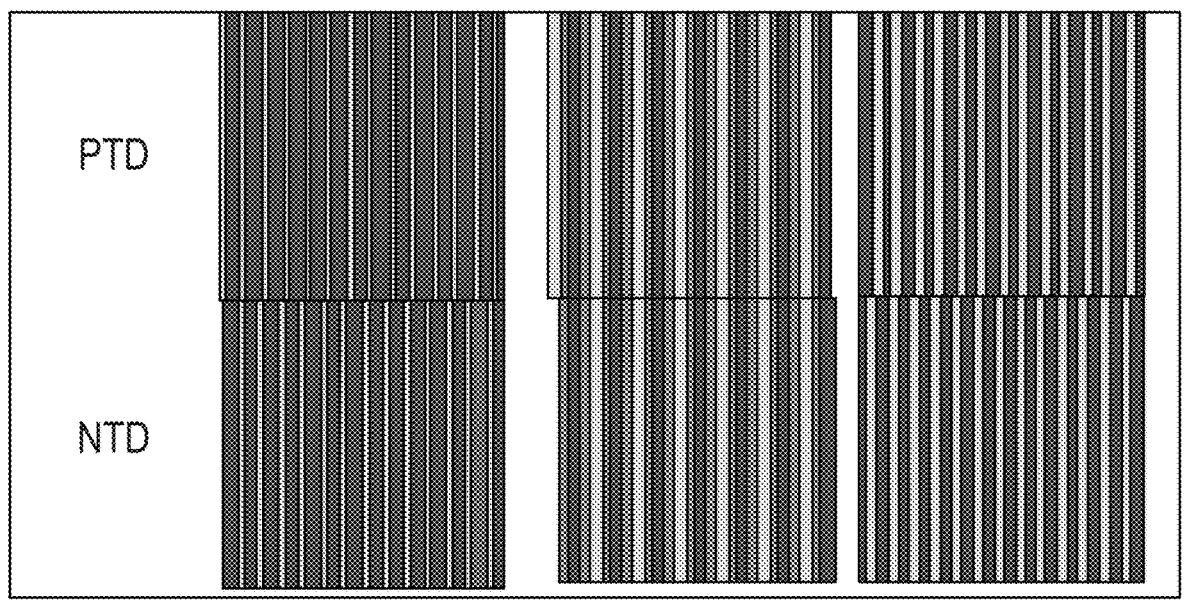
FIG. 1N is a comparison of the relief pattern for positive (PTD) and negative (NTD) processes, where (a) is accomplished by lithography, (b) is accomplished by supercritical $CO_2$ emulsion (SCE) and (c) by double patterning (DPT).

FIG. 1N shows a top down view comparing the lines formed by positive photoresist (PTD) and negative photoresist (NTD) development. Results are compared for the (a) the lithographic process of the present disclosure to previous methods where the photoresist was removed by (b) supercritical $CO_2$ emulsion (SCE) and (c) by double patterning DPT. The lithographic process of the present disclosure clearly shows smaller line widths and more even spacing than the SCE and DPT methods. Additionally, the lithographic method for the negative photoresist row appears to show more even line widths than the lithographic method positive photoresist line widths.

Figure 2A:
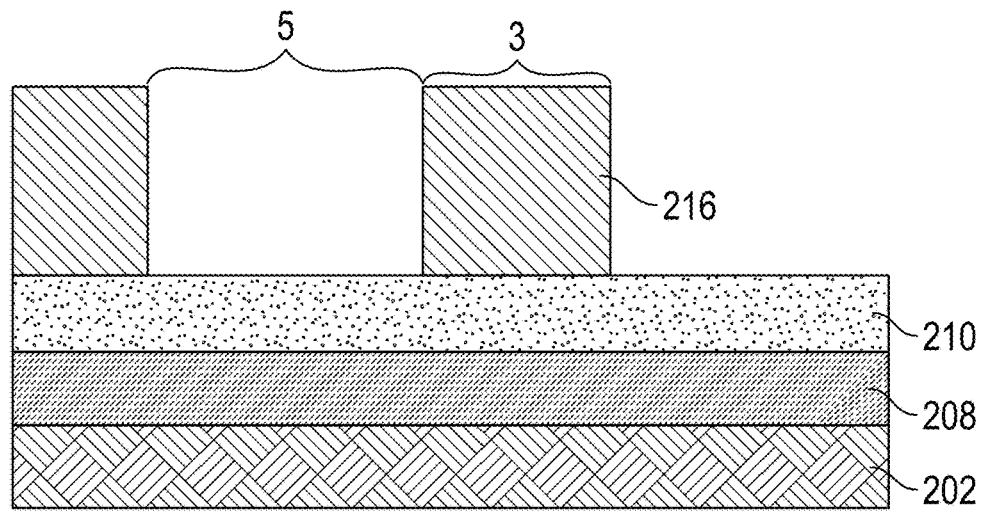
FIG. 2A illustrates a stack of layers on a substrate, with a photoresist layer on top which has been patterned in a 5:3 pattern, having spaces of 5 units to lines of 3 units, according to certain embodiments.

In a second process flow, layers are stacked on a substrate with resist on top. A lithographic exposure and development process is used to form a relief pattern of lines. This can include lines formed on a first layer, the first layer on a second layer, and the second layer on an underlying layer or substrate. By way of a non-limiting example, the lines can be formed of photoresist 216, with the photoresist formed on (or over any interfacial or intermediate layers), then over an oxide layer 210, which in turn is formed on a layer of nitride 208, such as silicon nitride, SiN, which is over a substrate 202 as shown in FIG. 2A. The relief pattern is of lines having a line-to-space ratio of 3:5 in that lines have a width of three units relative to spaces having a width of five units. FIG. 2A shows a cross sectional substrate segment with 3:5 pitch ratio lines on a substrate stack of substrate layer 202, nitride layer 208 and oxide layer 210.

Figure 2B:
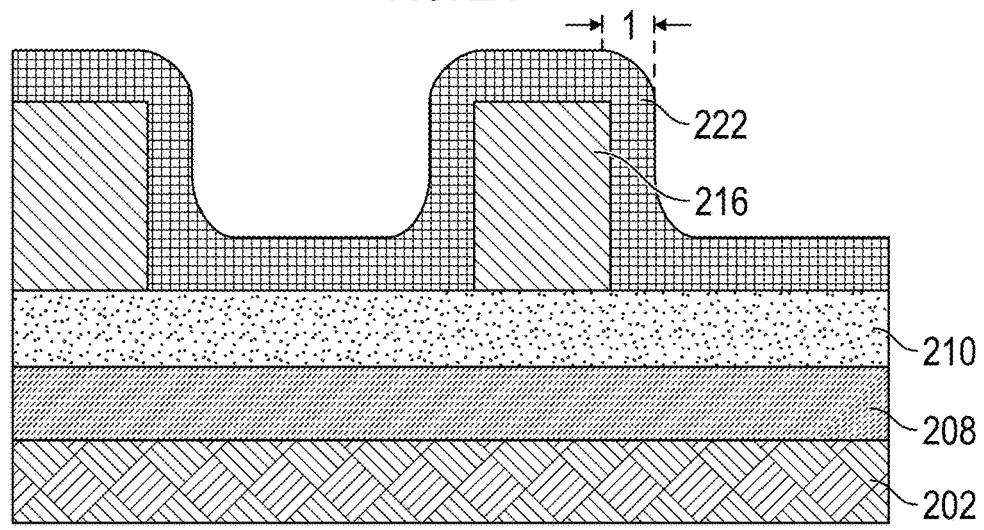
FIG. 2B illustrates a spacer formed on the substrate, according to certain embodiments.

In FIG. 2B, spacer deposition is executed with spacers 222 having a thickness equal to one third of the line thickness. This is a conformal deposition in that a thickness on all surfaces (horizontal and vertical) is generally uniform.

Figure 2C:
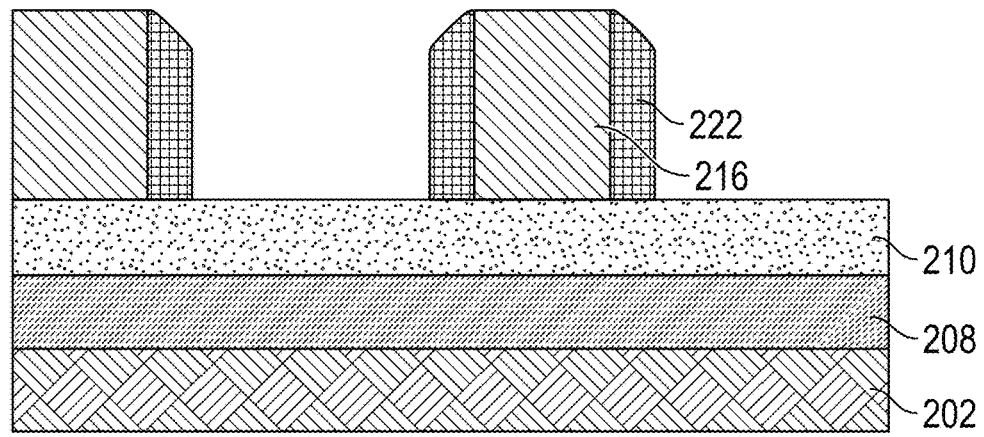
FIG. 2C, illustrates the substrate having portions of the spacer removed between the lines, leaving sidewall spacers on the lines and exposing the tops of the lines, according to certain embodiments.

In FIG. 2C, a "spacer open" etch is then executed. This is an anisotropic/directional etch that etches a thickness of the spacer to remove spacer material from horizontal surfaces, leaving sidewall spacers on sidewalls of the photoresist lines. The spacer 222 is etched between the photoresist lines, down to the oxide layer 210, leaving spacers on either side of the photoresist. The spacer 222 is also removed from the tops of the photoresist lines to expose the photoresist 216.

Figure 2D:
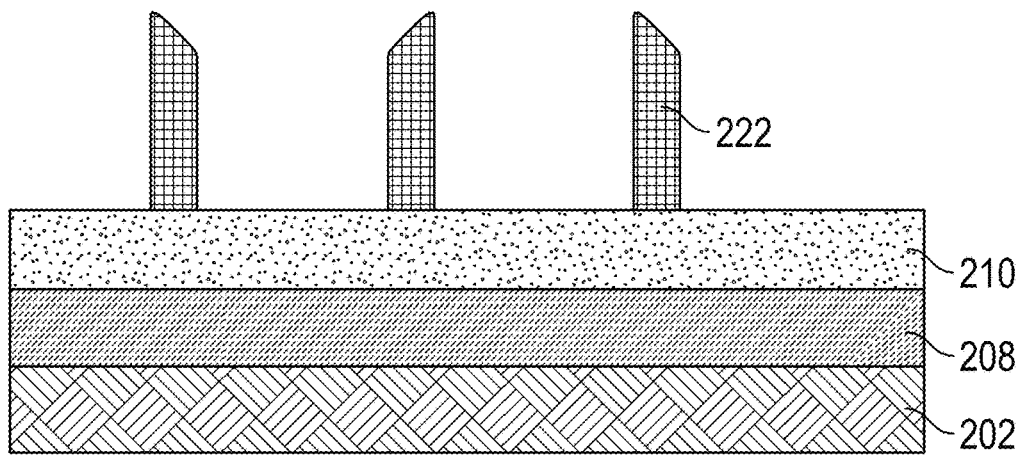
FIG. 2D illustrates the substrate with the photoresist removed, leaving the sidewall spacers to form a second relief pattern, according to certain embodiments.

In FIG. 2D, the photoresist mandrel is removed from between the spacer 222 sidewalls. This leaves the sidewall spacers on the substrate as a new relief pattern.

Figure 2E:
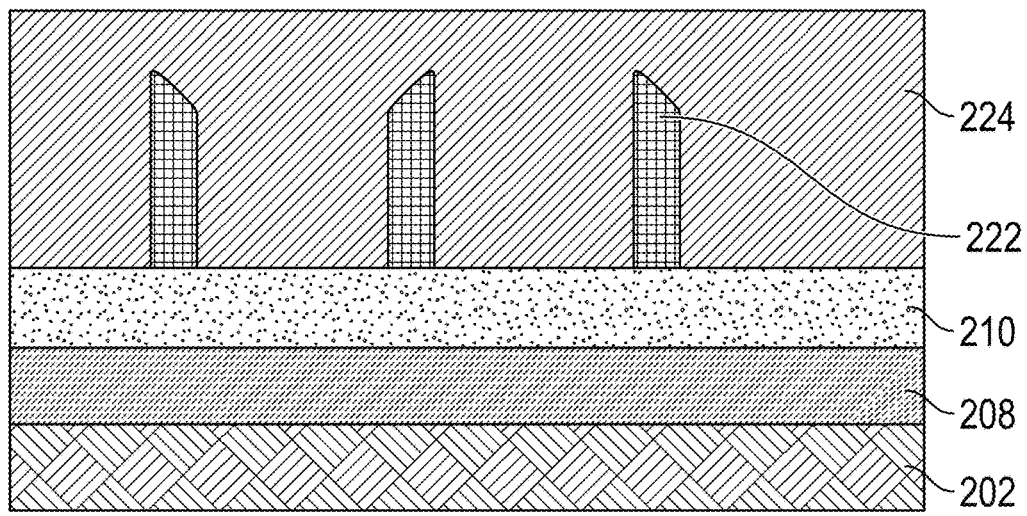
FIG. 2E illustrates a fill material covering the substrate, according to certain embodiments.

In FIG. 2E, a fill material 224 is deposited on the substrate so that it fills the spaces between lines of the spacer 222. The fill material 224 may comprise at least one of amorphous carbon, silicon oxycarbide (SiOC), silicon nitride (SiN), an organic planarization layer (OPL), titanium nitride (TiN), and high-density plasma (HDP) nitride. The fill material 224 is preferably self-planarizing, and capable of being etched back.

Figure 2F:
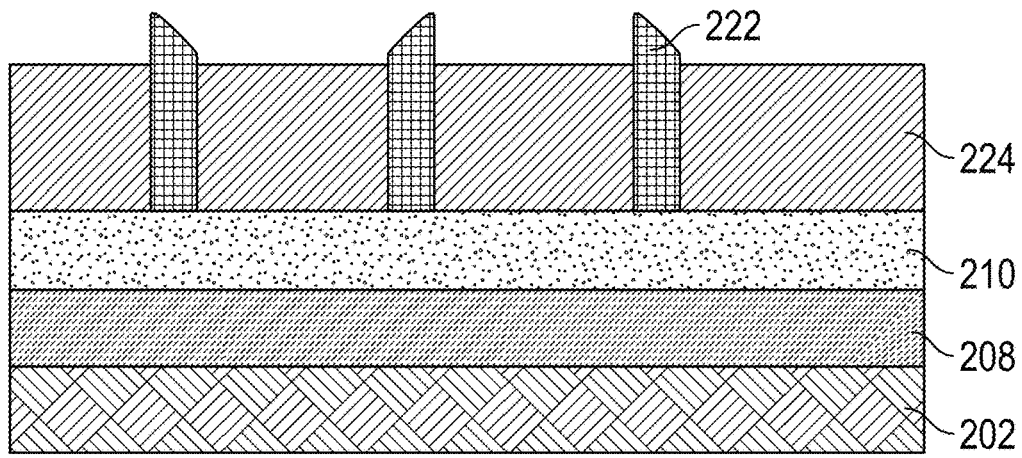
FIG. 2F illustrates removal of a portion of the fill material, leaving the tops of the sidewall spacers exposed, according to certain embodiments.

In FIG. 2F, a directional etch is applied which uncovers the tops of the sidewall spacers. Initially, the fill can result in an overcoat. The fill material 224 can be an organic reversal planarizing material.

Figure 2G:
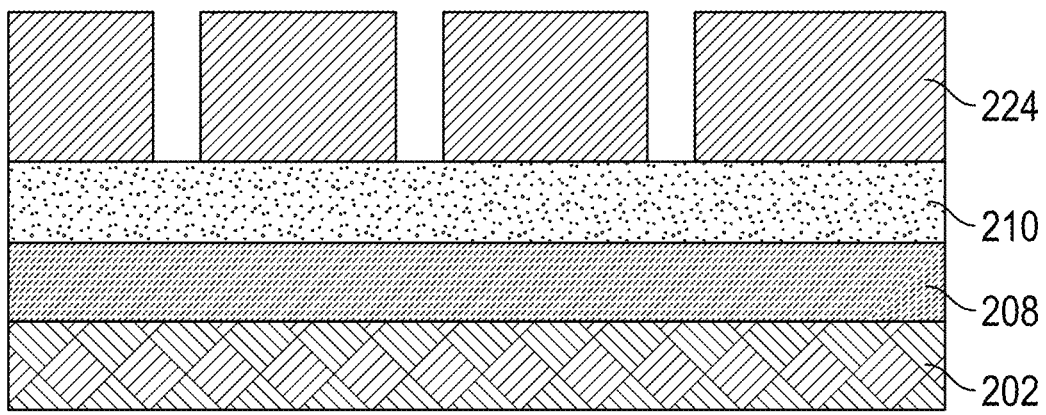
FIG. 2G illustrates the substrate with the sidewall spacers removed, according to certain embodiments.

In FIG. 2G, the overburden portion of the spacer 222 is then removed by a planarization process, such as a precision etch back. The sidewall spacers are then removed from the substrate. This results in the fill material 224 defining a second relief pattern, which is the reverse of the sidewall spacer pattern.

Figure 2H:
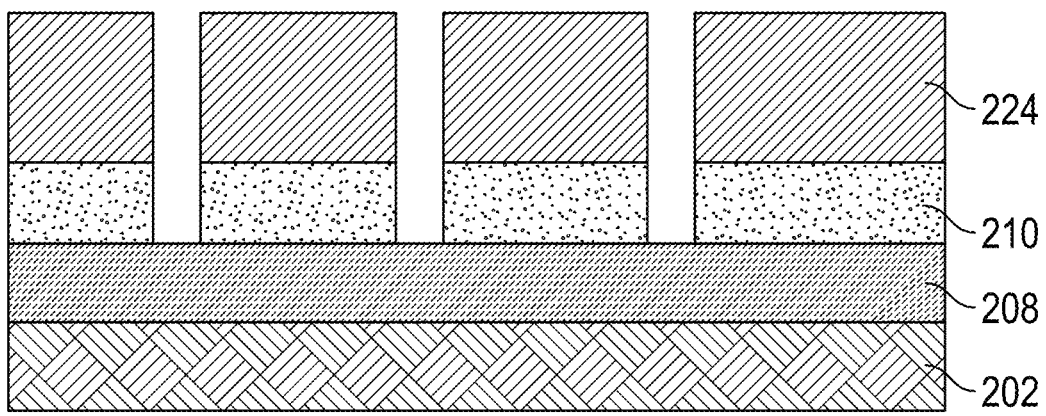
FIG. 2H illustrates the pattern of FIG. 2G transferred to an oxide layer, according to certain embodiments.

In FIG. 2H, the second relief pattern is transferred into the oxide layer 210, by etching through the first layer (oxide layer 210) down to the second layer (nitride layer 208). Stacks are formed by the oxide 210 covered by fill material 224 with open spaces between the stacks where the spacer was removed.

Figure 2I:
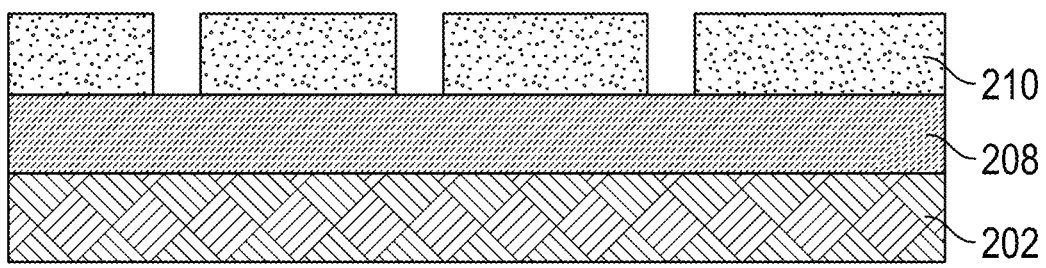
FIG. 2I illustrates the substrate with the fill material removed, according to certain embodiments.

In FIG. 2I, the fill material 224 and the nitride 208 are removed by an etching processes, leaving the oxide layer 210 as the relief pattern.

Figure 2J:
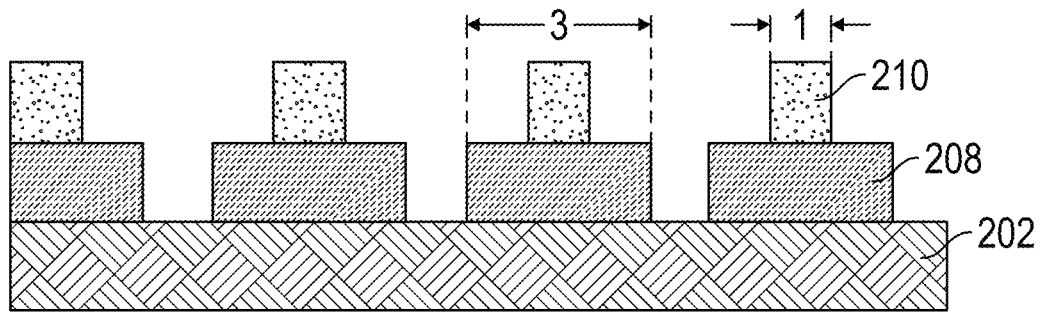
FIG. 2J illustrates the oxide layer trimmed to one-third its width, according to certain embodiments.

In FIG. 2J, the nitride layer 208 is etched down to the top of the substrate layer 202 in the regions not protected by the oxide layer 210. Then the oxide upper lines are trimmed by an isotropic trimming etch. The etch is continued until the width of each of the lines of the first layer is one third its initial width. Thus, an initial line of three units is reduced to one unit in width, centered on the second layer lines, which still have a width of three units.

Figure 2K:
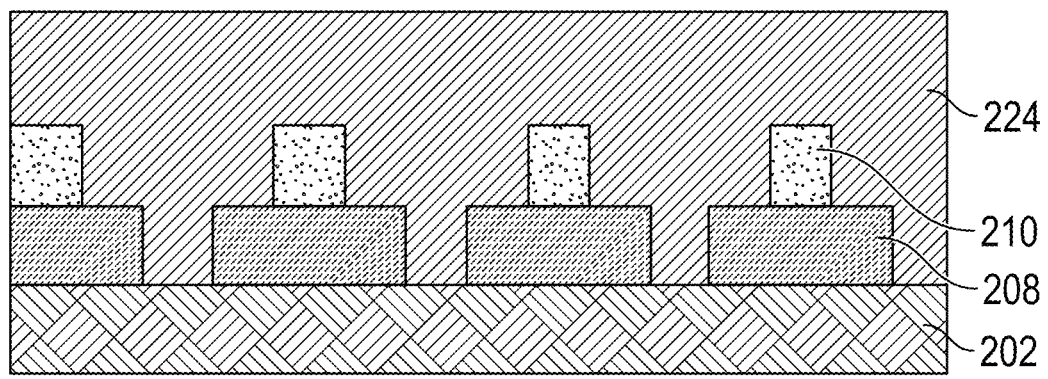
FIG. 2K illustrates a fill material covering the substrate, according to certain embodiments.
Figure 2L:
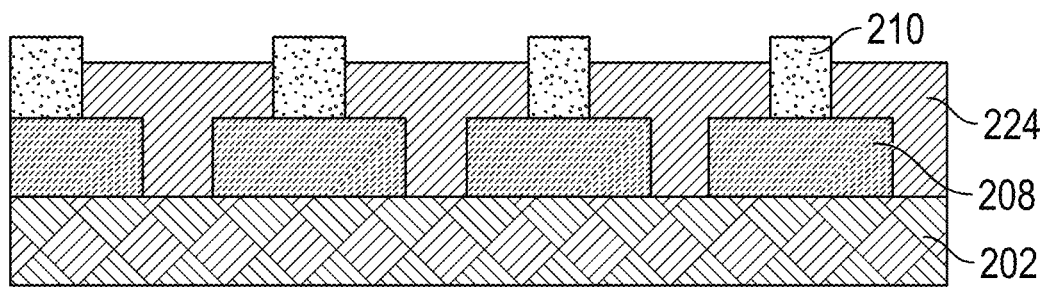
FIG. 2L illustrates the exposure of the tops of the oxide lines, according to certain embodiments.
Figure 2M:
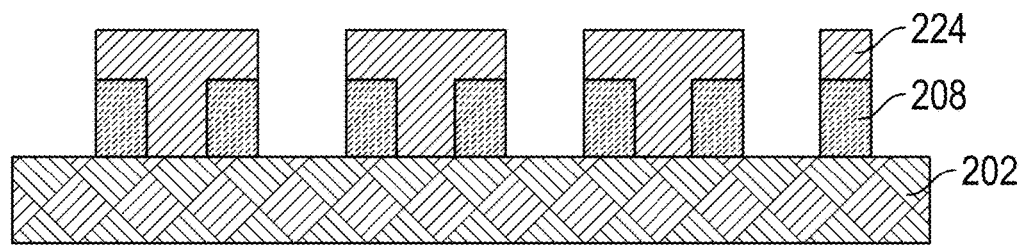
FIG. 2M illustrates the substrate with the oxide lines and portions of the nitride layer below the oxide lines removed, according to certain embodiments.

In FIG. 2K, a second fill material is then deposited over the relief pattern, which can be the same planarizing fill material as the first fill material 224, and is also labelled 224 in FIG. 2K to FIG. 2M.

In FIG. 2L, the overburden of fill material is then removed to uncover top surfaces of the trimmed lines of oxide 210 of the first layer. The fill material 224 still covers top surfaces of the second layer (nitride 208) lines.

In FIG. 2M, the trimmed (oxide layer 210) lines are etched out, leaving the fill material 224 to function as a relief pattern and an etch mask to protect all but the center single width of the nitride layer 208. Removing the first layer uncovers a center portion of the lines of the second layer. This center portion opening between the lines is a unit in width.

Figure 2N:
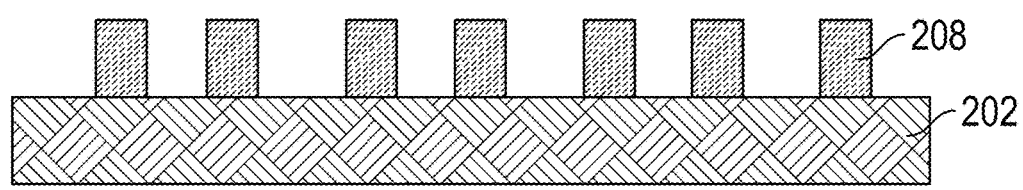
FIG. 2N illustrates the one-to-one pattern of lines and spaces with the fill material removed, according to certain embodiments.

In FIG. 2N, the nitride layer 208 is then etched by directional etching down to the substrate 202 layer and all remaining fill material 224 is removed, leaving a pattern of nitride lines on the substrate. Effectively, the trimmed lines are reversed and transferred into underlying lines to result in a line-to-space ratio of 1:1.

Figure 2O:
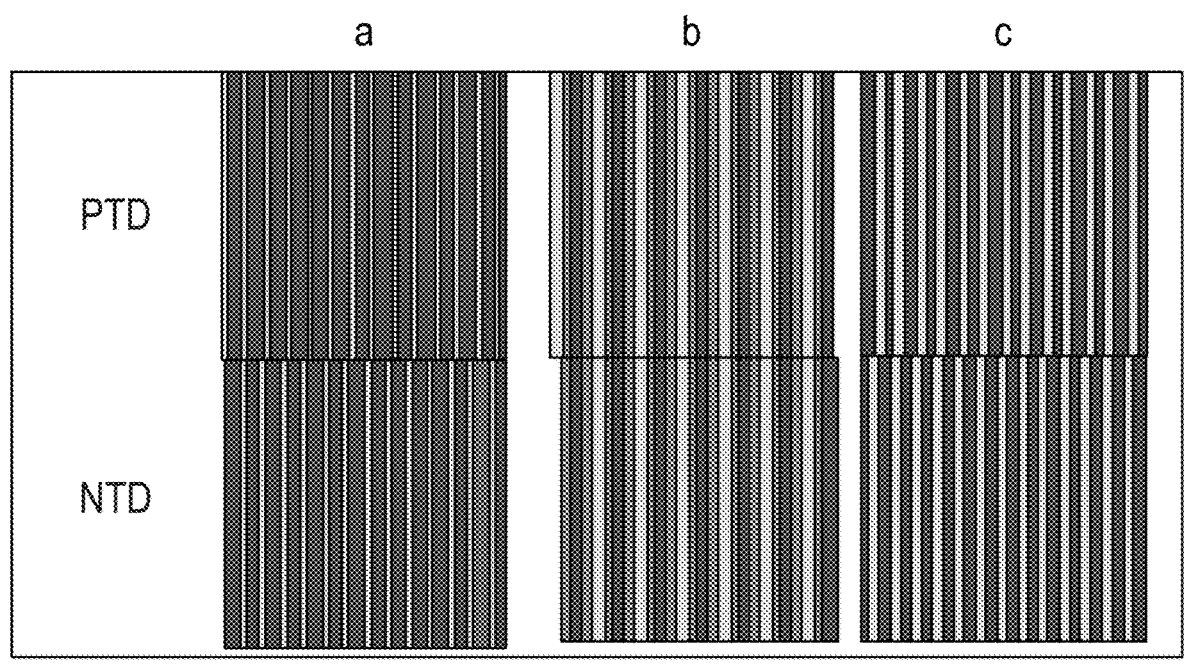
FIG. 2O illustrates is a comparison of the relief pattern for positive (PTD) and negative (NTD) processes, where (a) is accomplished by lithography, (b) is accomplished by supercritical $CO_2$ emulsion (SCE) and (c) by double patterning (DPT).

FIG. 2O, shows a top down view comparing the lines formed by positive photoresist (PTD) and negative photoresist (NTD) development. Results are compared for the (a) the lithographic process of the present disclosure to previous methods where the photoresist was removed by (b) supercritical CO2 emulsion (SCE) and (c) by double patterning (DPT). The lithographic process of the present disclosure clearly shows smaller line width and more even spacing than the SCE and DPT methods. Additionally, the lithographic method on the negative photoresist row appears to show more even line widths than the lithographic method positive photoresist line widths.

In a third process flow, a double stack staircase process is described which quadruples a single line stack. Layers are stacked on a substrate with resist on top. A lithographic exposure and development process is used to form a relief pattern of lines.

Figure 3A:
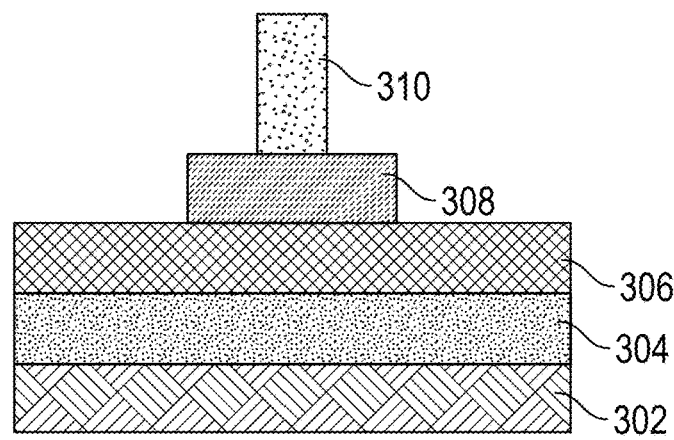
FIG. 3A illustrates an initial stack of layers for a method which quadruples a single line, according to certain embodiments.

The double stack staircase may start at the step previously shown as FIG. 1G. FIG. 3A shows a single line section of the three lines shown in FIG. 1G. At this point, an oxide layer 310, which may be $SiO_2$, has been etched to a line of one unit in width, and the underlying nitride layer 308, which may be SiN or TiN, has been etched to a width of 3 units. The remaining stack is an etch stop layer, 306, a memorization layer 304 and a substrate 302, which is a wafer. The memorization layer 304 can be a hardmask or metal hard mask and is formed over the substrate 302. The etch stop layer 306 can also act as a memorization layer, and is formed over the memorization layer 304. The etching may be performed by anisotropic (directional) plasma-based reactive etching.

Figure 3B:
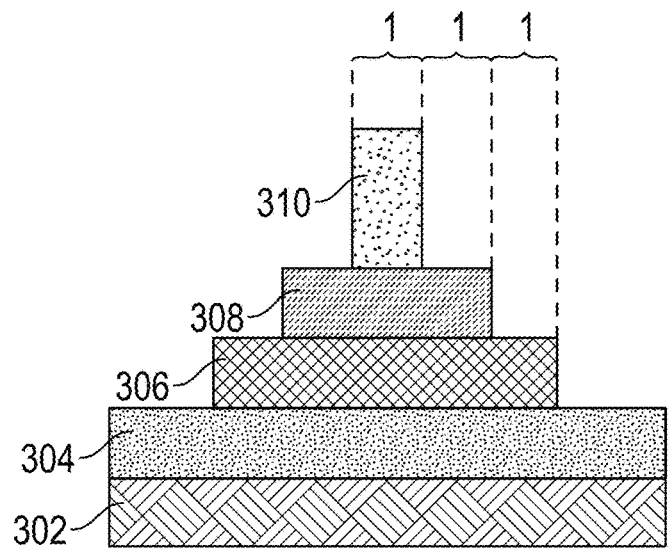
FIG. 3B illustrates a trimmed stack having a first line of one unit, a second line of three units, a third line of five units on top of a memorization layer, which is on top of a substrate, according to certain embodiments.

In FIG. 3B, a selective etch is executed which directionally etches etch stop layer 306 to a width of five units. A "staircase" structure with steps of one unit in width is now centered about the line formed in oxide layer 310.

Figure 3C:
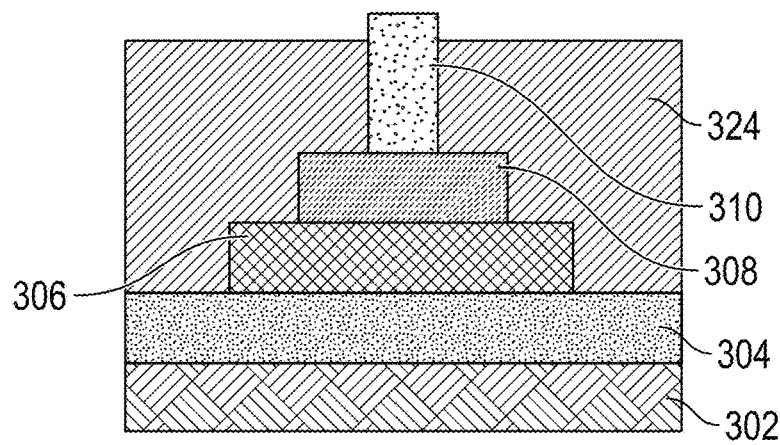
FIG. 3C illustrates a first fill material covering the substrate with the top of first line exposed, according to certain embodiments.

In FIG. 3C, the structure of FIG. 3B is covered with a fill layer 324, leaving only the tops of oxide layer 310 exposed. The fill layer 324 can be an organic reversal planarizing material.

Figure 3D:
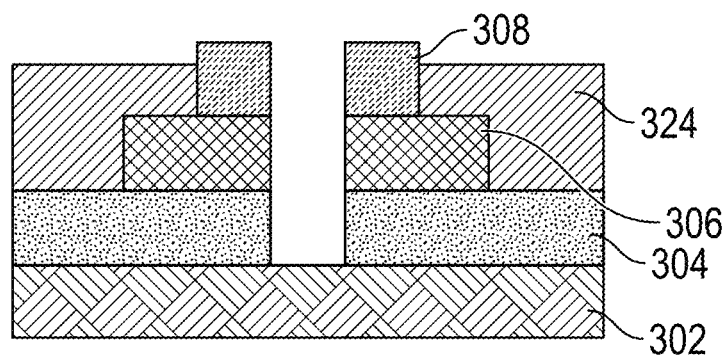
FIG. 3D illustrates the substrate with the first line etched down to the substrate, according to certain embodiments.

In FIG. 3D, the oxide layer 310, the nitride layer 308, the etch stop layer 306 and the memorization layer 304 are etched down to the substrate layer, splitting the structure into two parts. The fill layer 324 is etched down below the top of the nitride layer, leaving the tops of the nitride layer halves exposed.

Figure 3E:
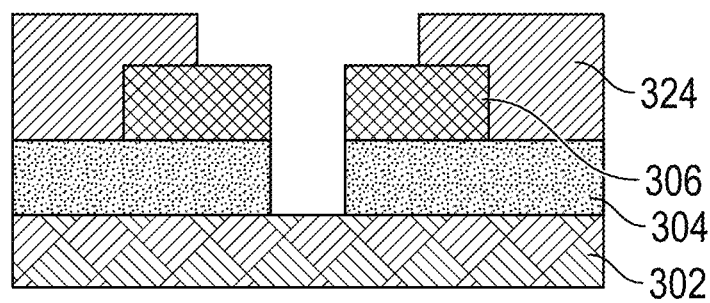
FIG. 3E illustrates the substrate with the second line removed, according to certain embodiments.

In FIG. 3E, the remaining nitride layer 308 portions have been removed by selective etching.

Figure 3F:
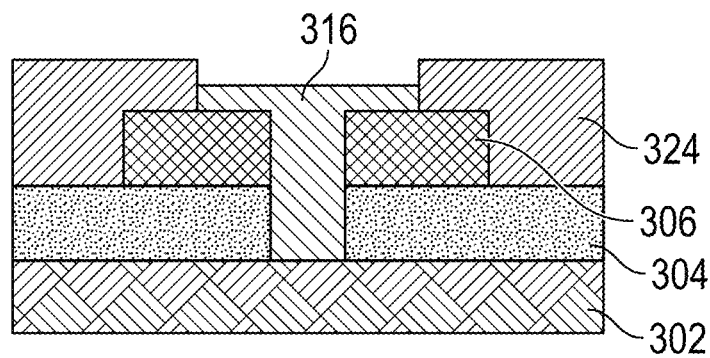
FIG. 3F illustrates a second fill material deposited in the cavity formed by etching the first and second lines from the substrate, according to certain embodiments.

In FIG. 3F, the central cavity formed by etching the oxide layer and underlying layers plus the nitride layer is filled with photoresist 316 to just below the top of fill layer 324.

Figure 3G:
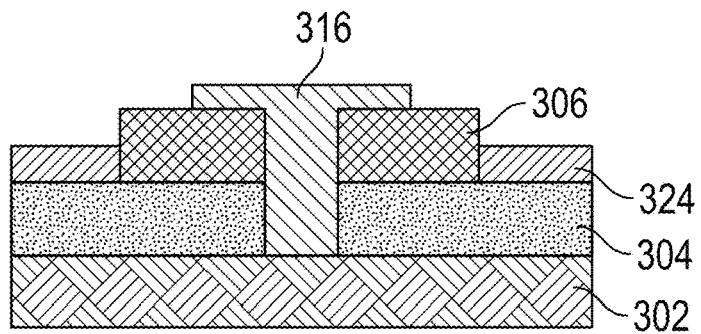
FIG. 3G illustrates a removal of a portion of the first fill material to expose a portion of the third line, according to certain embodiments.

In FIG. 3G, etch stop layer 306 and fill layer 324 are selectively etched to open etch stop layer 306.

Figure 3H:
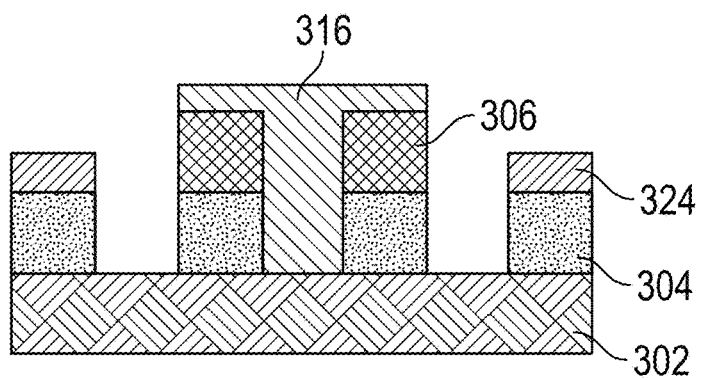
FIG. 3H illustrates removal of the third line and the portion of the memorization layer below the third line, according to certain embodiments.

In FIG. 3H, the open portion of etch stop layer and the portion of the memorization layer 304 are etched down to the substrate layer 302. The remaining portion of etch stop layer 306 has been protected by the photoresist layer 318 from the etch process and the remaining portion of memorization layer 304 has been protected by fill layer 324 from the etch process. Thus, the stack formed by memorization layer 304 covered by the fill material 324 defines a line.

Figure 3I:
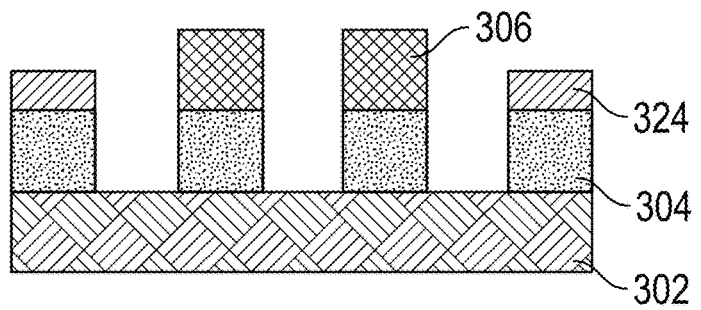
FIG. 3I illustrates the substrate with the second fill material removed, according to certain embodiments.

In FIG. 3I, the photoresist mandrel is removed from the space between the center lines, leaving four lines, where the outer two are covered with fill material 324 and the inner two are covered by etch stop layer 306.

Figure 3J:
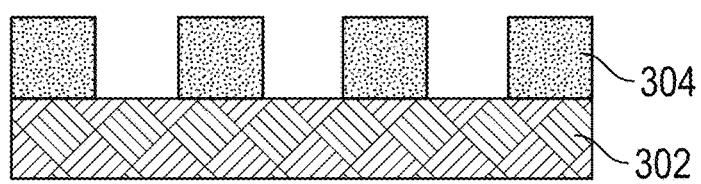
FIG. 3J illustrates the quadrupled first line pattern having a 1:1 ratio of lines and spaces, according to certain embodiments.

In FIG. 3J, the fill material 324 and etch stop layer 306 are removed from the lines, leaving the final structure of four evenly spaced lines with a line-to-space ratio of 1:1. Thus, the single line of FIG. 3A has been quadrupled to four evenly spaced lines using two fill processes and no spacers.

The double stack staircase process can be repeated by forming a second underlying stack of layers between the first stack of layers and the substrate, transferring the structure of four evenly spaced lines with a line-to-space ratio of 1:1 into an underlying layer and repeating the double stack staircase process. This embodiment will form eight lines from an initial single line of the first relief pattern.

Figure 4A:
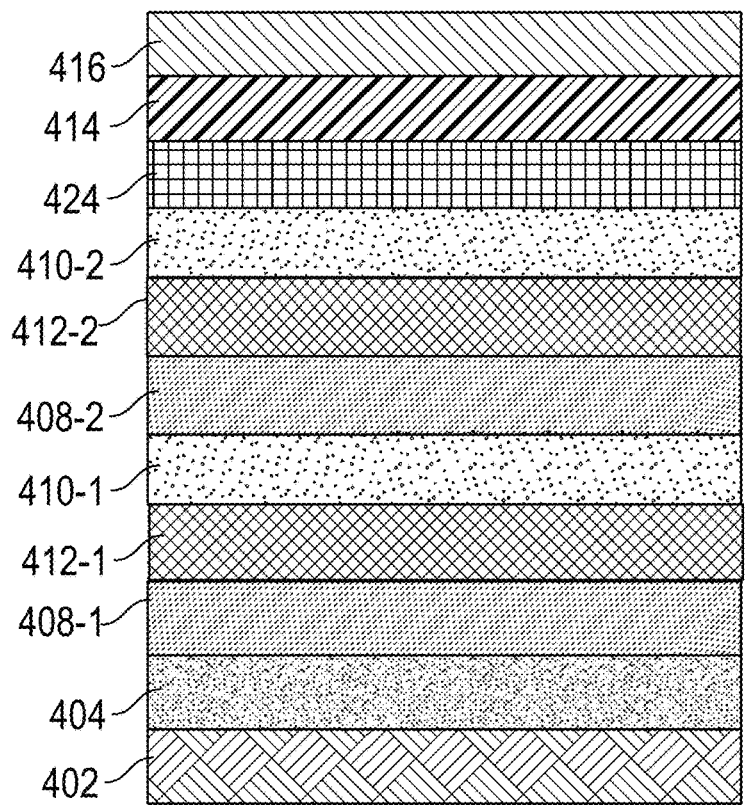
FIG. 4A illustrates a double stack of layers formed on a substrate, according to certain embodiments.
Figure 4B:
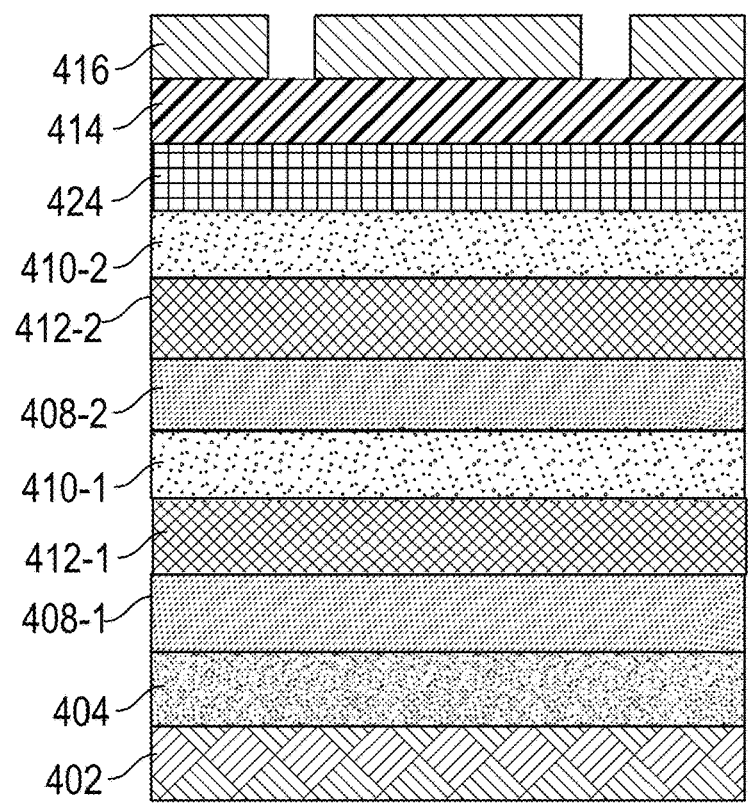
FIG. 4B illustrates a 1:1 pattern formed in a photoresist layer, according to certain embodiments.
Figure 4C:
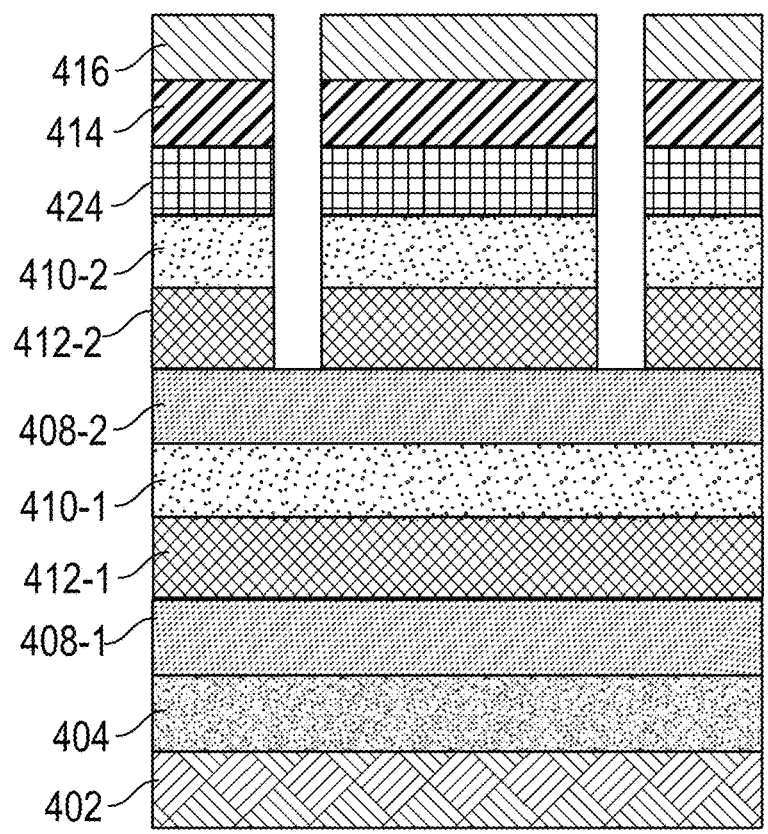
FIG. 4C illustrates the etch transfer of the 1:1 pattern into the next four underlying layers, according to certain embodiments.
Figure 4D:
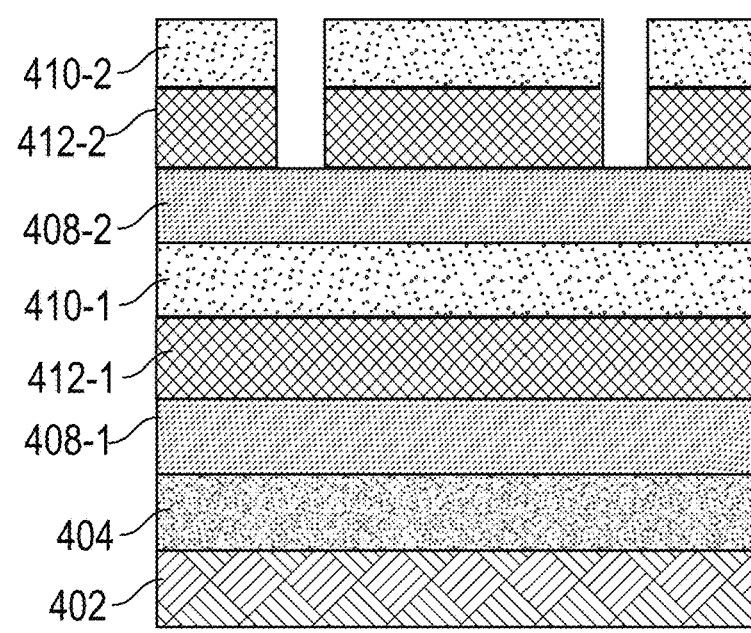
FIG. 4D illustrates the removal of two of the overburden layers, according to certain embodiments.
Figure 4E:
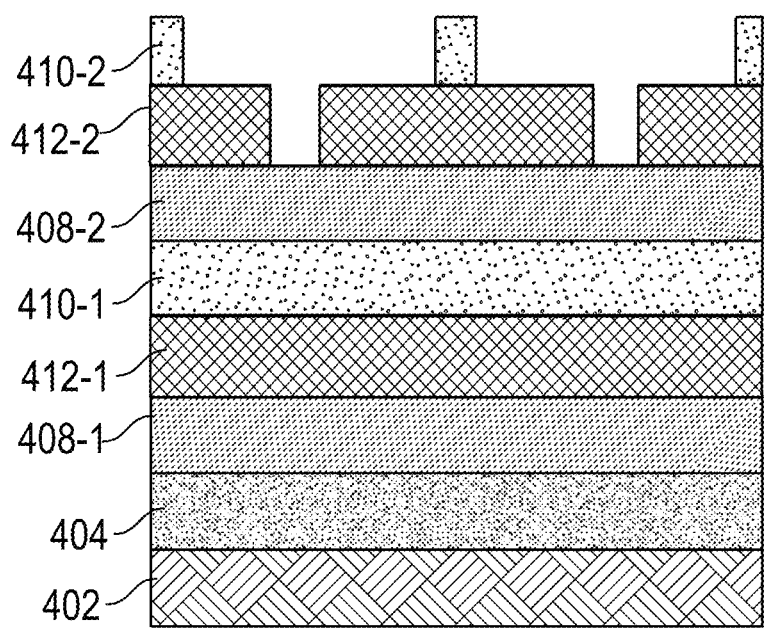
FIG. 4E a first staircase with top lines trimmed to one fifth of their original width, according to certain embodiments.
Figure 4F:
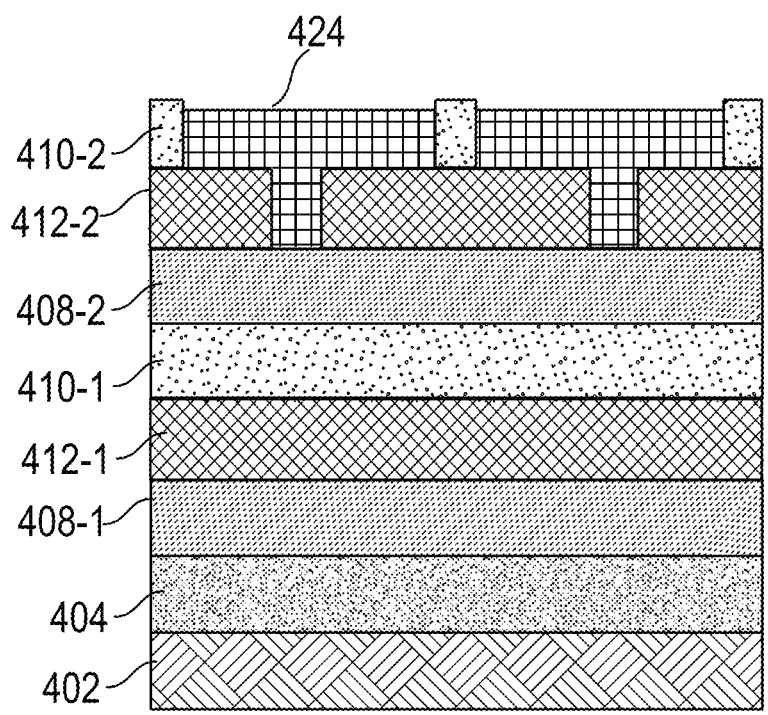
FIG. 4F illustrates reverse image organic planarization covering the two top lines, according to certain embodiments.
Figure 4G:
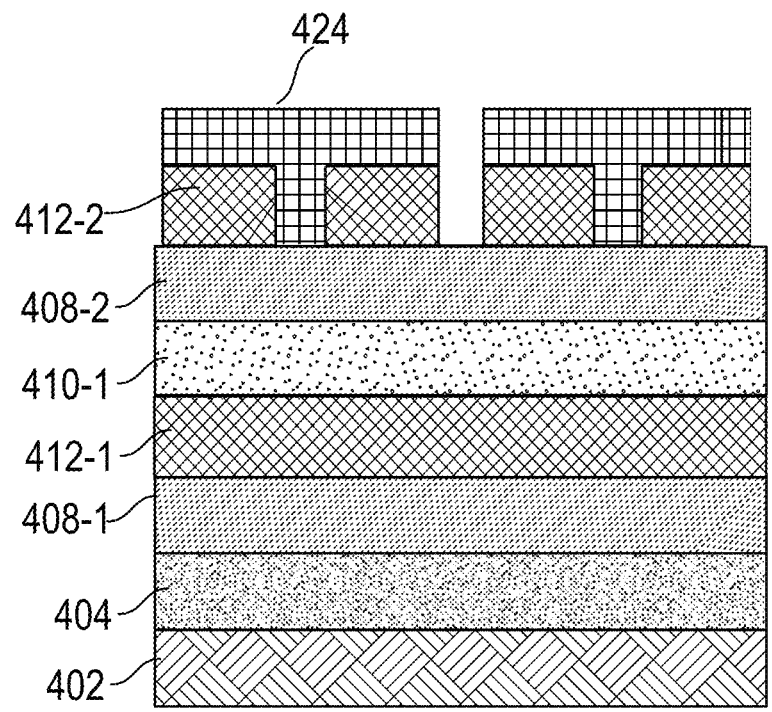
FIG. 4G illustrates the substrate etched through the top lines, according to certain embodiments.
Figure 4H:
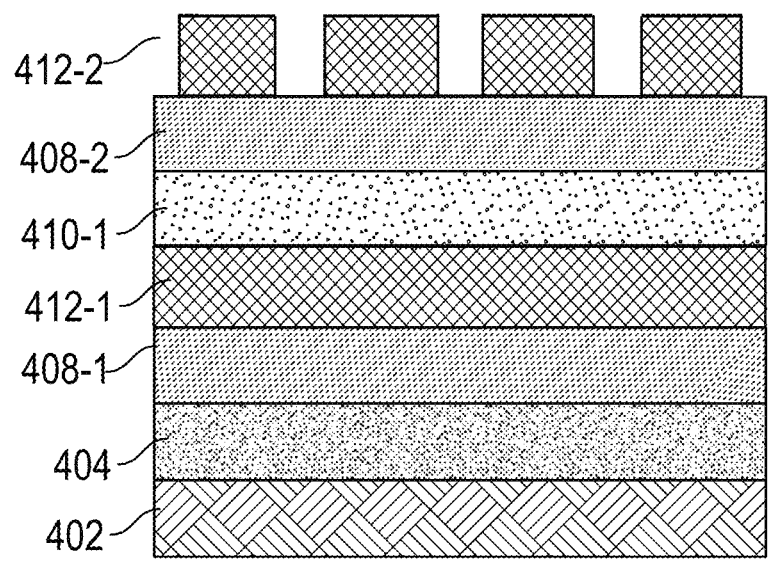
FIG. 4H illustrates removal of the organic planarization material, according to certain embodiments.
Figure 4I:
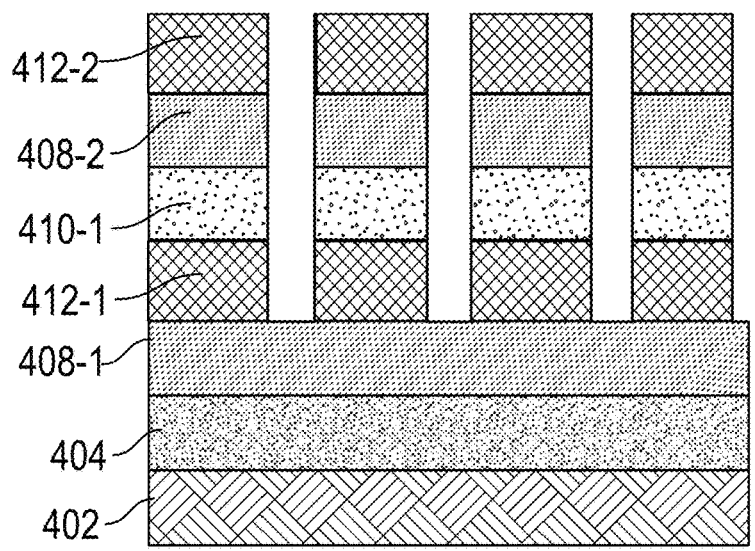
FIG. 4I illustrates transfer into underlying layers, according to certain embodiments.
Figure 4J:
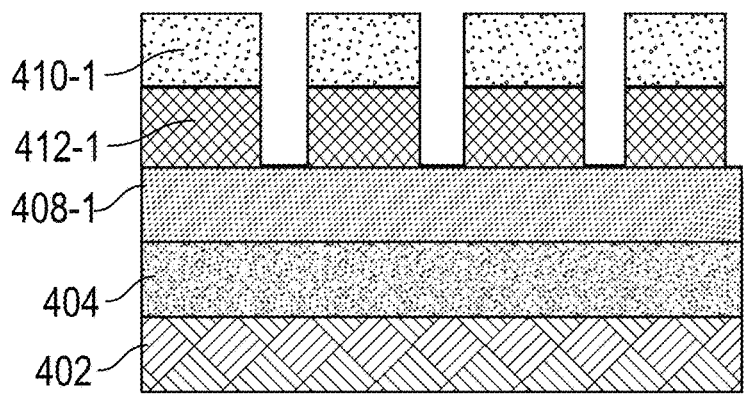
FIG. 4J illustrates removal of the top two layers, according to certain embodiments.
Figure 4K:
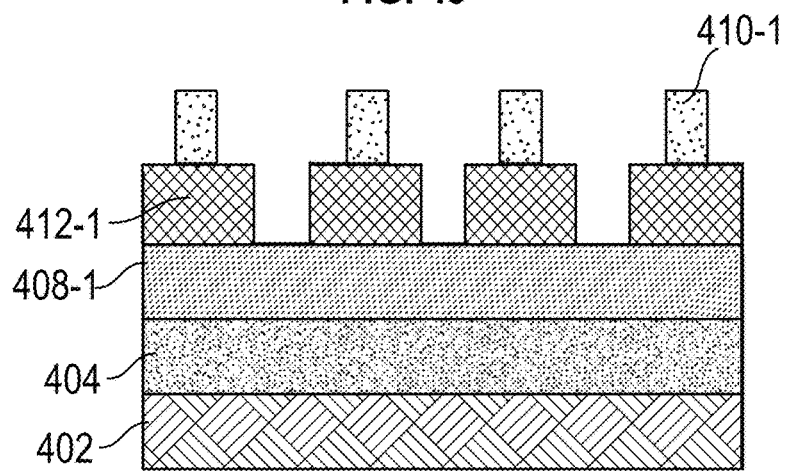
FIG. 4K illustrates a second staircase step with top lines trimmed to one third of their original width, according to certain embodiments.
Figure 4L:
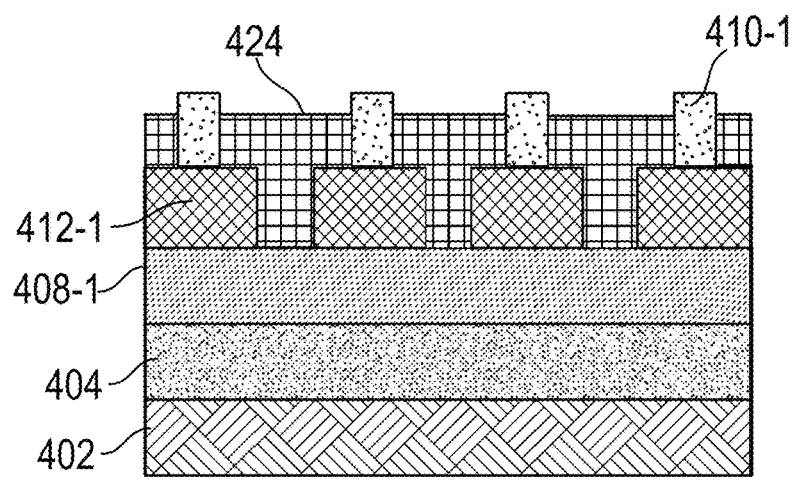
FIG. 4L illustrates reverse image organic planarization covering the two top lines of FIG. 4K, according to certain embodiments.
Figure 4M:
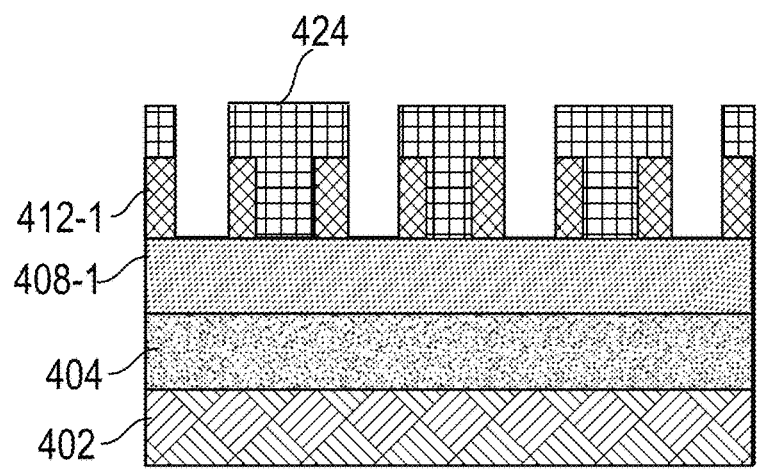
FIG. 4M illustrates the substrate top two lines etched in regions not covered by the reverse image organic planarization, according to certain embodiments.
Figure 4N:
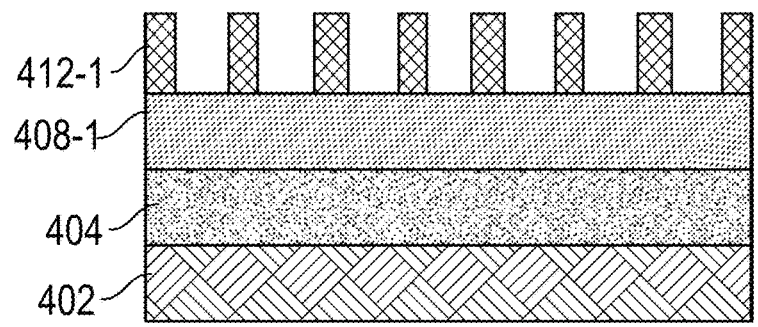
FIG. 4N illustrates removal of the overburden layer, according to certain embodiments.
Figure 4O:
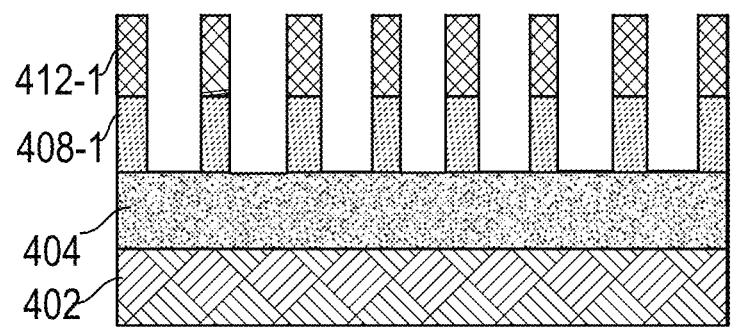
FIG. 4O illustrates transfer of the pattern of FIG. 4N into a hardmask layer, according to certain embodiments.
Figure 4P:
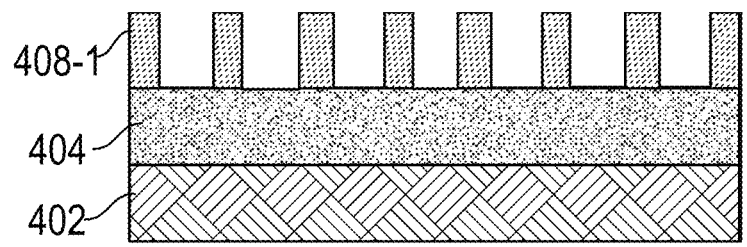
FIG. 4P illustrates removal of the overburden layer of FIG. 4O, according to certain embodiments.
Figure 4Q:
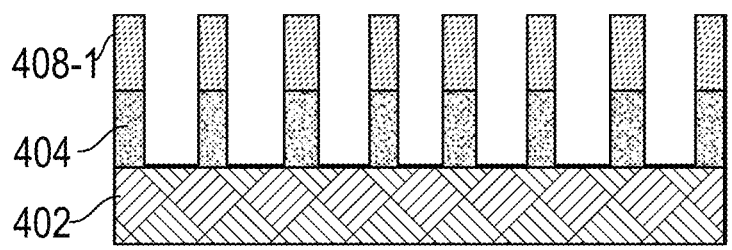
FIG. 4Q illustrates transfer of the pattern into a memorization layer, according to certain embodiments.
Figure 4R:
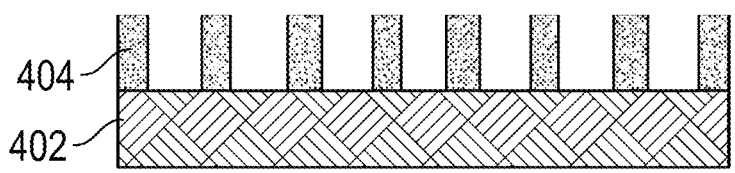
FIG. 4R illustrates the substrate with all layers above the memorization layer removed, according to certain embodiments.

A fourth process which achieves finer line widths is described in FIG. 4A-FIG. 4R. The processes described above can be repeated in a stack having two sets of layers comprising the nitride layer, the amorphous carbon layer and the oxide layer. An organic planarization layer covers the two sets of layers and an Si-ARC layer covers the organic planarization layer. The fourth process flow describes a line structure which starts with the stack of repeating layers. For the purpose of describing the fourth process, the 5:3 pattern of the first process is used as a first set of layers. The fourth stack may have a substrate layer 402, a memorization layer 404, a first nitride layer 408-1, a first amorphous carbon layer 412-1, a first oxide layer 410-1, a second nitride layer 408-2, a second amorphous carbon layer 410-2, a second oxide layer 410-2, an organic planarization layer 424, an Si-ARC layer 414-2 and a top layer of photoresist 416. The materials of the layers are substantially the same as the materials described above for FIG. 1A-FIG. 1L.

As shown in FIG. 4B, the photoresist layer is exposed to a pattern of actinic radiation that defines a line-to-space pitch ratio of 7:1. That is, for each unit width, lines are $7/8^{th}$ of a unit wide and spaces between lines are $1/8^{th}$ of a unit wide. The latent pattern is developed using a solvent to etch a relief pattern with this 7:1 ratio in photoresist layer 416. With the 7:1 pitch pattern formed, this pattern can be transferred into one or more underlying target layers, such as by anisotropic (directional) plasma-based reactive etching.

As shown in FIG. 4C, the openings in the photoresist pattern are anisotropically etched through the Si-ARC layer 414, the organic planarization layer 424, the second oxide layer 410-2 and the second amorphous carbon layer 412-2.

In FIG. 4D, Si-ARC layer 414 and the organic planarization layer 424 are removed by an etching process, leaving the second oxide layer 410-2 and the second amorphous carbon layer 412-2 as the relief pattern for processing the underlying first set of layers.

In FIG. 4E, each line of second oxide layer 410-2 is trimmed to one seventh its width by an isotropic (non-directional) etch. Thus, $3/7$ of the initial line width can be etched away each side of a given line of the oxide layer 410-2. Each line of the oxide layer 410-2 now has a width of $1/8$ of the initial pitch. This etch is selective to the oxide layer 410-1 and does not etch the second amorphous carbon layer 412-2 or the underlying second nitride layer 408-2.

In FIG. 4F, a fill material is deposited on the substrate, leaving the tops of the lines formed by the second oxide layer 410-2. The fill material may be an organic reverse image planarization material.

In FIG. 4G, the pattern is etched through the second oxide layer 410-2 lines down to the second nitride layer 412-2.

In FIG. 4H, the fill material is removed, leaving a four line pattern in the second amorphous carbon layer 412-2.

In FIG. 4I, the second amorphous carbon layer 412-2 acts as an etch stop layer to protect underlying layers during an isotropic etch through second nitride layer 408-2, first oxide layer 410-1 and first amorphous carbon layer 412-1.

In FIG. 4J, the second amorphous carbon layer 412-2 and second nitride layer 408-2 are removed.

In FIG. 4K, the substrate is exposed to a pattern of actinic radiation that defines a line-to-space pitch ratio of 1:3. That is, lines are one unit wide and spaces between lines are three units wide. The latent pattern is developed using a solvent to etch a relief pattern with this 1:3 ratio in the first oxide layer 410-1. With the 1:3 pitch pattern formed, this pattern can be transferred into one or more underlying target layers, such as by anisotropic (directional) plasma-based reactive etching.

In FIG. 4L, a fill material 424, which may be an organic planarization material, is formed over the pattern of FIG. 4K, leaving the tops of the first oxide layer 410-1 exposed.

In FIG. 4M, an anisotropic etch is executed that etches through the first oxide layer 410-1 and into portions of first amorphous carbon layer 412-1 not covered by fill material 424.

In FIG. 4N, the remaining fill material 424 is removed, leaving the lines formed by first amorphous carbon layer 412-1.

In FIG. 4O, the pattern is transferred into the first nitride layer 408-1.

In FIG. 4P, the first amorphous carbon layer 412-1 is removed.

In FIG. 4Q, the pattern of FIG. 4P is transferred into the memorization layer 404.

In FIG. 4R, the remaining portions of layer first nitride layer 408-1 are removed by etching or planarizing, leaving a 1:1 line/space pattern of four lines resulting from each original one line of FIG. 4B. The initial center line shown in FIG. 4B has undergone two staircase processes leaving four lines with a 1:1 space to line ratio. Accordingly, techniques herein can provide pitch reduction (staircase patterning) without using spacers. This can improve LER/LWR, eliminate overlay errors from stitching layers, as well as provide efficiencies in manufacturing.

In the preceding description, specific details have been set forth, such as a particular geometry of a processing system and descriptions of various components and processes used therein. It should be understood, however, that techniques herein may be practiced in other embodiments that depart from these specific details, and that such details are for purposes of explanation and not limitation. Embodiments disclosed herein have been described with reference to the accompanying drawings. Similarly, for purposes of explanation, specific numbers, materials, and configurations have been set forth in order to provide a thorough understanding. Nevertheless, embodiments may be practiced without such specific details. Components having substantially the same functional constructions are denoted by like reference characters, and thus any redundant descriptions may be omitted.

Various techniques have been described as multiple discrete operations to assist in understanding the various embodiments. The order of description should not be construed as to imply that these operations are necessarily order dependent. Indeed, these operations need not be performed in the order of presentation. Operations described may be performed in a different order than the described embodiment. Various additional operations may be performed and/or described operations may be omitted in additional embodiments.

"Substrate" or "target substrate" as used herein generically refers to an object being processed in accordance with the invention. The substrate may include any material portion or structure of a device, particularly a semiconductor or other electronics device, and may, for example, be a base substrate structure, such as a semiconductor wafer, or a layer on or overlying a base substrate structure such as a thin film. Thus, substrate is not limited to any particular base structure, underlying layer or overlying layer, patterned or un-patterned, but rather, is contemplated to include any such layer or base structure, and any combination of layers and/or base structures. The description may reference particular types of substrates, but this is for illustrative purposes only.

Those skilled in the art will also understand that there can be many variations made to the operations of the techniques explained above while still achieving the same objectives of the invention. Such variations are intended to be covered by the scope of this disclosure. As such, the foregoing descriptions of embodiments of the invention are not intended to be limiting. Rather, any limitations to embodiments of the invention are presented in the following claims.

Obviously, numerous modifications and variations of the present invention are possible in light of the above teachings. It is therefore to be understood that within the scope of the appended claims, the invention may be practiced otherwise than as specifically described herein.

The invention claimed is:

1. A method of patterning a substrate, the method comprising:
   providing a substrate;
   depositing a stack of layers on the substrate, the stack of layers comprising a first layer deposited on a second layer, the second layer deposited on at least one of a first set of underlying layers;
   forming a first relief pattern of lines over the first layer and the second layer, the first layer formed on the second layer, the second layer formed on the at least one underlying layer, the first relief pattern of lines having a line-to-space ratio of 3:5 in that lines have an initial line width of three units relative to spaces having an initial space width of five units;
   forming sidewall spacers on sidewalls of the first relief pattern of lines, the sidewall spacers having a thickness equal to one third the initial line width, thereby having a relative thickness of one unit;
   removing, by selective anisotropic etching, a material forming the first relief pattern of lines from the substrate and depositing a first fill material between the sidewall spacers;
   removing the sidewall spacers from the substrate resulting in the first fill material defining a second relief pattern, the second relief pattern having a line-to-space pitch ratio of 3:1 in that lines have a width of three units relative to spaces having a width of one unit;
   transferring, by selective anisotropic etching, the second relief pattern into the first layer and into the second layer;
   removing, by planarization, the first fill material from the substrate;
   executing a first trimming etch process, the first trimming etch process being an isotropic etch that etches material of the first layer without etching material of the second layer and without etching material of an underlying layer, the first trimming etch process being executed until an initial line width of lines from the first layer is reduced to one third of the initial line width, resulting in lines of the first layer being centered on lines of the second layer, the lines of the second layer maintaining the initial width of three units;
   depositing a second fill material between lines of the first layer and the second layer such that top surfaces of lines of the second layer are covered while top surfaces of lines of the first layer are uncovered;
   removing a material of the first layer from the substrate;
   forming a third relief pattern by removing, by selective anisotropic etching, a first portion of a material of the second layer which is not covered by the second fill material,
   transferring, by selective anisotropic etching, the third relief pattern into lines of the second layer, resulting in the second layer having a line-to-space pitch ratio of 1:1, wherein each line and each space has a width of one unit.

2. The method of claim 1, wherein the first fill material and the second fill material are organic reversal self-planarizing materials.

3. The method of claim 1, further comprising:
   performing the planarization by a precision etch back process.

4. The method of claim 1, further comprising:
   forming the first relief pattern by:
      depositing a photoresist over the first layer; and
      exposing the photoresist to a pattern of actinic radiation that defines the line-to-space pitch ratio of 3:5.

5. The method of claim 4, wherein the photoresist is one of a positive photoresist and a negative photoresist.

6. The method of claim 1, further comprising:
   forming the first layer from one of silicon dioxide or titanium dioxide; and
   forming the second layer from one of silicon nitride or titanium nitride.

7. The method of claim 1, wherein each line and each space of the second relief pattern has a width in a range of 10 nm to 21 nm.

8. The method of claim 1, further comprising:
   forming the first set of underlying layers by
      depositing a first underlying layer on the substrate;
      depositing a second underlying layer on the first underlying layer;
      depositing a third underlying layer on the second underlying layer; and
      depositing a fourth underlying layer on the third underlying layer.

9. The method of claim 8, further comprising:
   transferring, by selective anisotropic etching, the third relief pattern into the fourth underlying layer, the third underlying layer and the second underlying layer;
   removing, by planarization, the second layer;
   executing a second trimming etch process, the second trimming etch process being an isotropic etch that etches material of the fourth underlying layer without etching material of the third underlying layer and without etching material of the second underlying layer, the first trimming etch process being executed until a line width of lines from the fourth underlying layer is reduced to one fifth of an initial line width of one unit, resulting in lines of the fourth underlying layer being centered on lines of the third underlying layer, the lines of the third underlying layer and the second underlying layer maintaining the initial line width of one unit; and
   executing a third trimming etch process on the third underlying layer, the third trimming etch process being an isotropic etch that etches material of the third underlying layer without etching material of the fourth underlying layer and without etching material of the second underlying layer, the second trimming etch process being executed until the line width of the third underlying layer is reduced to three fifths of the initial width of one unit, resulting in lines of the third underlying layer being centered on lines of the second underlying layer, the lines of the second underlying layer maintaining the initial line width of one unit.

10. The method of claim 9, further comprising:
depositing a third fill material on lines of the fourth underlying layer, lines of the third underlying layer, lines of the second underlying layer and on lines of the first underlying layer;
etching the third fill material to expose a top of the lines of the fourth underlying layer;
etching the lines of the fourth underlying layer through the fourth underlying layer, the third underlying layer, the second underlying layer and the first underlying layer down to a top of the substrate, forming a central bore;
removing a portion of the third fill material from substrate to expose a top of the lines of the third underlying layer;
removing, by selective anisotropic etching, the lines of third underlying layer, without etching the third fill material;
depositing a fourth fill material in the central bore and over exposed portions of the second underlying layer;
removing the third fill material to expose portions of the lines of the second underlying layer not covered by the fourth fill material;
selectively etching through the exposed portions of the lines of the second underlying layer not covered by the second fill material down through the first underlying layer to the top of the substrate;
removing the fourth fill material and the third fill material;
etching remaining portions of the second layer, resulting in each line of the first underlying layer having a line-to-space pitch ratio of 1:1, wherein each line and each space of the first underlying layer has a width of one fifth of one unit.

11. The method of claim 10, wherein each line and each space of the first underlying layer has a width in a range of 2 to 5 nm.

12. The method of claim 1, further comprising:
forming the first set of underlying layers by
depositing a first memorization layer on the substrate;
depositing a first etch stop layer on the first memorization layer;
depositing a first nitride layer on the first etch stop layer;
depositing a first oxide layer on the first nitride layer; and
depositing a first amorphous carbon layer on the first oxide layer.

13. The method of claim 12, further comprising:
transferring, by selective anisotropic etching, the second relief pattern into the first amorphous carbon layer;
removing, by planarization, the first layer and the second layer;
transferring, by selective anisotropic etching, the second relief pattern into the first oxide layer;
removing, by planarization, the first amorphous carbon layer;
transferring, by selective anisotropic etching, the second relief pattern into the first nitride layer;
removing, by planarization, the first oxide layer;
transferring, by selective anisotropic etching, the second relief pattern into the first etch stop layer;
removing, by planarization, the first nitride layer;
transferring, by selective anisotropic etching, the second relief pattern into the first memorization layer; and
removing, by planarization, the first etch stop layer, resulting in the first memorization layer having the line-to-space pitch ratio of 1:1, wherein each line and each space has a width of one unit.

14. The method of claim 13, further comprising:
forming a second set of underlying layers between the substrate and the first memorization layer by:
depositing a second memorization layer over the substrate;
depositing a second etch stop layer over the second memorization layer;
depositing a second nitride layer over the second etch stop layer;
depositing a second oxide layer over the second nitride layer; and
depositing a second amorphous carbon layer over the second oxide layer.

15. The method of claim 14,
transferring, by selective anisotropic etching between the lines of the first memorization layer, the line-to-space pitch ratio of 1:1 into the second amorphous carbon layer;
removing, by planarization, the first memorization layer;
transferring, by selective anisotropic etching between the lines of the second amorphous carbon layer, the line-to-space pitch ratio of 1:1 into the second oxide layer;
executing a second etch process, the second etch process being an isotropic etch that etches the second amorphous carbon layer without etching the second oxide layer and without etching the second nitride layer, the second etch process being executed until a width of each line from the second amorphous carbon layer is reduced to one fifth of one unit, resulting in the lines of the second amorphous carbon layer being centered on the lines of the second oxide layer, the lines of the second oxide layer maintaining a line width of one unit;
depositing a second spacer over the lines of the second amorphous carbon layer, the lines of the second oxide layer and the second nitride layer;
forming second sidewall spacers by etching the second spacer to open portions between the lines of the second amorphous carbon layer and the lines of the second oxide layer;
removing, by selective anisotropic etching, the second amorphous carbon layer between the second sidewall spacers without etching the sidewall spacers;
forming a third relief pattern by removing, by selective anisotropic etching, a first portion of the second oxide layer between the second sidewall spacers without removing a second portion of the second oxide layer beneath the second sidewall spacers of the second amorphous carbon layer;
transferring, by selective anisotropic etching, the third relief pattern into the second nitride layer and the second etch stop layer;
removing, by planarization, the second spacers, the second portion of the second oxide layer and the second nitride layer; and
transferring, by selective anisotropic etching, the third relief pattern into the second memorization layer, the third relief pattern resulting in a line-to-space pitch ratio of 1:1, wherein each line and each space has a width of one fifth of one unit.

16. The method of claim 15, wherein the third relief has a line width in a range of 2 to 5 nm.

17. A method of patterning a substrate, the method comprising:

forming a first stack of layers on the substrate, the first stack including a first layer deposited over the substrate, a second layer deposited over the first layer, a third layer deposited over the second layer and a fourth layer deposited over the third layer, each of the layers of the first stack having an initial width that is equal;

forming a first relief pattern on the stack of layers, by:

executing a first trimming etch process on the fourth layer, the first trimming etch process being an isotropic etch that etches material of the fourth layer without etching material of the second layer and without etching material of the third layer, the first trimming first etch process being executed until the initial width of the fourth layer is reduced to a first line of a first desired line width;

executing a second trimming etch process on the third layer, the second trimming etch process being an isotropic etch that etches material of the third layer without etching material of the fourth layer and without etching material of the second layer, the second trimming etch process being executed until the initial width of the fourth layer is reduced to a second line having a line width which is three times the first desired line width;

executing a third trimming etch process on the second layer, the third trimming etch process being an isotropic etch that etches material of the second layer without etching material of the first layer and the third layer, the third trimming etch process being executed until the initial width of the second layer is reduced to a third line having a line width which is five times the first desired line width;

depositing a first fill material on the fourth, third and second layers;

etching a portion of the first fill material to expose a top of the first line;

etching the first line through the fourth, third and second layers down to the substrate, thus forming a first central bore;

removing, by etching, the third layer and the fourth layer;

depositing a second fill material in the first central bore;

removing a portion of the first fill material to expose a part of the second layer;

selectively etching through the part of the second layer not covered by the second fill material and through portions of the first layer not covered by the first fill material;

removing the first fill material and the second fill material; and removing, by etching, the second layer, resulting in the first layer having a second relief pattern of four lines with line-to-space pitch ratio of 1:1, wherein each line and each space has a width of one fifth of the first desired line width.

18. The method of claim 17, wherein each line and each space of the second relief pattern has a width in a range of 10 nm to 21 nm.

19. A method of patterning a substrate, the method comprising:

forming a first stack of layers on a substrate, the first stack including a memorization layer deposited over the substrate, a first nitride layer deposited over the memorization layer, a first amorphous carbon layer deposited over the first nitride layer and a first oxide layer deposited over the first amorphous carbon layer;

forming a second stack of layers over the first stack of layers, the second stack including a second nitride layer deposited over the first oxide layer, a second amorphous carbon layer deposited on the second nitride layer, a second oxide layer deposited over the second amorphous carbon layer, an organic planarization layer deposited over the second oxide layer and a silicon anti-reflective coating deposited over the organic planarization layer, wherein each of the layers of the first stack and second stack have equal initial width;

depositing a photoresist relief pattern of lines over the silicon anti-reflective coating;

transferring, by selective anisotropic etching, the photoresist relief pattern of lines into the silicon anti-reflective coating, the organic planarization layer, the second oxide layer, and the second amorphous carbon layer, then removing the photoresist, the anti-reflective coating and the organic planarization layer;

executing a first trimming etch process on the second oxide layer, the first trimming etch process being an isotropic etch that etches material of the second oxide layer without etching material of the second amorphous carbon layer and without etching material of the second nitride layer, the first trimming etch process being executed until the initial width of each line of the second oxide layer is reduced to one seventh of a line width of each line of the photoresist relief pattern;

executing a second trimming etch process on the second amorphous carbon layer, the second trimming etch process being an isotropic etch that etches material of the amorphous carbon layer without etching material of the second oxide layer and without etching material of the second nitride layer, the second trimming etch process being executed until the initial width of each line of the amorphous carbon layer is reduced to three eighths of the line width of each line the photoresist relief pattern;

depositing a first fill material on the second oxide layer, the amorphous carbon layer and the second nitride layer;

etching a portion of the first fill material to expose a top of the lines of the second oxide layer;

etching the lines of the second oxide layer down through the second amorphous carbon layer, then removing the first fill material, the lines of the second amorphous carbon layer forming a second relief pattern;

transferring, by selective anisotropic etching, the second relief pattern into the second nitride layer, the first oxide layer, and the first amorphous carbon layer, then removing the second amorphous carbon layer and the second nitride layer;

executing a fourth trimming etch process on the first oxide layer, the fourth trimming etch process being an isotropic etch that etches material of the first oxide layer without etching material of the first amorphous carbon layer or material of the first nitride layer, the fourth trimming etch process being executed until the width of the lines of the first oxide is reduced to one third of the line width of the second relief pattern;

depositing a second fill material on the first oxide layer, the first amorphous carbon layer and the first nitride layer;

etching a portion of the second fill material to expose a top of the lines of the first oxide layer;

etching the lines of the first oxide layer down through the first amorphous carbon layer, then removing the second fill material, thus forming a third relief pattern;

transferring, by selective anisotropic etching, the third relief pattern into the first nitride layer, then removing the first amorphous carbon layer, thus forming a fourth relief pattern;

transferring, by selective anisotropic etching, the fourth relief pattern into the memorization layer, then removing the first nitride layer, resulting in the memorization layer having a pattern of four lines with line-to-space pitch ratio of 1:1, wherein each line and each space has a width of one eighth of the initial line width.

20. The method of claim 19, wherein each line and each space of the memorization layer has a width in a range of 2 to 5 nm.

\* \* \* \* \*